US012598764B2

(12) United States Patent
Lin et al.

(10) Patent No.: US 12,598,764 B2
(45) Date of Patent: Apr. 7, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Chih-Hung Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 564 days.

(21) Appl. No.: 18/097,250

(22) Filed: Jan. 15, 2023

(65) Prior Publication Data

US 2024/0120414 A1 Apr. 11, 2024

Related U.S. Application Data

(60) Provisional application No. 63/414,543, filed on Oct. 9, 2022.

(51) Int. Cl.

| | |
|---|---|
| *H01L 29/775* | (2006.01) |
| *H01L 29/06* | (2006.01) |
| *H01L 29/08* | (2006.01) |
| *H01L 29/423* | (2006.01) |
| *H01L 29/66* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 62/151* (2025.01); *H10D 64/017* (2025.01)

(58) Field of Classification Search
CPC .. H10D 30/43; H10D 30/014; H10D 30/6735; H10D 62/121; H10D 62/151; H10D 64/017; H10D 30/797; H10D 30/6757; H10D 62/822
USPC ........................................................ 257/347
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Tong-Ho Kim
(74) *Attorney, Agent, or Firm* — NZ Carr Law Office

(57) ABSTRACT

Embodiments of the present disclosure provide semiconductor device structures and methods of forming the same. The structure includes a semiconductor layer disposed over a substrate, and the semiconductor layer has a first end and a second end opposite the first end. The structure further includes an epitaxial feature disposed over the substrate, and the epitaxial feature is electrically connected to the first end of the semiconductor layer. The structure further includes a first dielectric layer disposed over the substrate, and the first dielectric layer is in contact with the second end of the semiconductor layer. The structure further includes a contact etch stop layer disposed on and in contact with the first dielectric layer and an interlayer dielectric layer disposed on and in contact with the contact etch stop layer.

20 Claims, 28 Drawing Sheets

(56)                    References Cited

U.S. PATENT DOCUMENTS

| | | | |
|---|---|---|---|
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0259759 | A1* | 8/2019 | Fung ................... H10D 84/853 |
| 2021/0035976 | A1* | 2/2021 | Gwon ................... H01L 23/535 |
| 2021/0305428 | A1* | 9/2021 | Ju ...................... H01L 21/76897 |
| 2021/0375685 | A1* | 12/2021 | Xie ...................... H10D 62/151 |
| 2022/0037528 | A1* | 2/2022 | Chuang ............. H10D 30/6757 |

* cited by examiner 106
108
106
108
106
108

104

101

100

B

A

B

A

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/414,543 filed Oct. 9, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-11A are cross-sectional side views of various stages of manufacturing the semiconductor device structure taken along line A-A of FIG. 1, in accordance with some embodiments.

FIGS. 3B-11B are cross-sectional side views of various stages of manufacturing the semiconductor device structure taken along line B-B of FIG. 1, in accordance with some embodiments.

FIGS. 15A-23A are cross-sectional side views of various stages of manufacturing the semiconductor device structure taken along line A-A of FIG. 1, in accordance with alternative embodiments.

FIGS. 15B-23B are cross-sectional side views of various stages of manufacturing the semiconductor device structure taken along line B-B of FIG. 1, in accordance with alternative embodiments.

DETAILED DESCRIPTION

Figure 1:
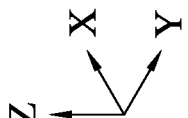
FIG. 1 is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, implementations of some aspects of the present disclosure may be used in other processes and/or in other devices, such as planar FETs, FinFETs, Horizontal Gate All Around (HGAA) FETs, Vertical Gate All Around (VGAA) FETs, nanosheet FETs, nanowire FETs, forksheet FETs, complementary FETs (CFETs), and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-10B show exemplary processes for manufacturing a semiconductor device structure 100 according to embodiments of the present disclosure. It is understood that additional operations can be provided before, during, and after processes shown by FIGS. 1-10B, and some of the operations described below can be replaced or eliminated, for additional embodiments of the method. The order of the operations/processes is not limiting and may be interchangeable.

FIG. 1 is a perspective view of one of various stages of manufacturing a semiconductor device structure 100, in accordance with some embodiments. As shown in FIG. 1, a semiconductor device structure 100 includes a stack of semiconductor layers 104 formed over a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2B:
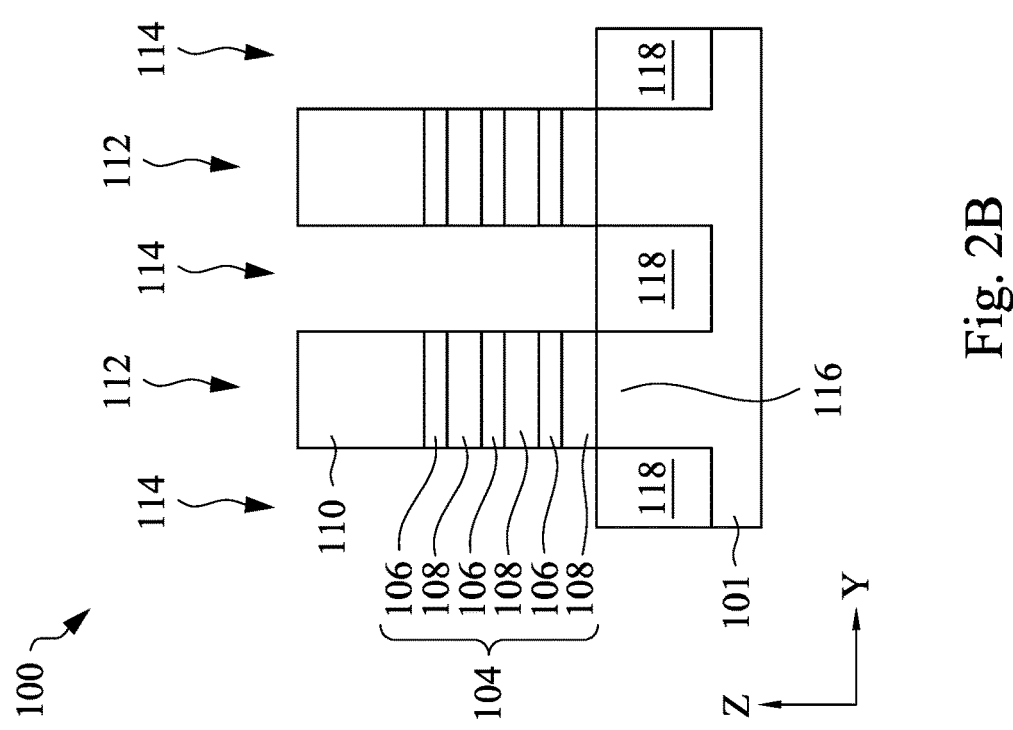
FIGS. 2A-2D are cross-sectional side views of various stages of manufacturing the semiconductor device structure taken along line A-A of FIG. 1, in accordance with some embodiments.
Figure 2A:
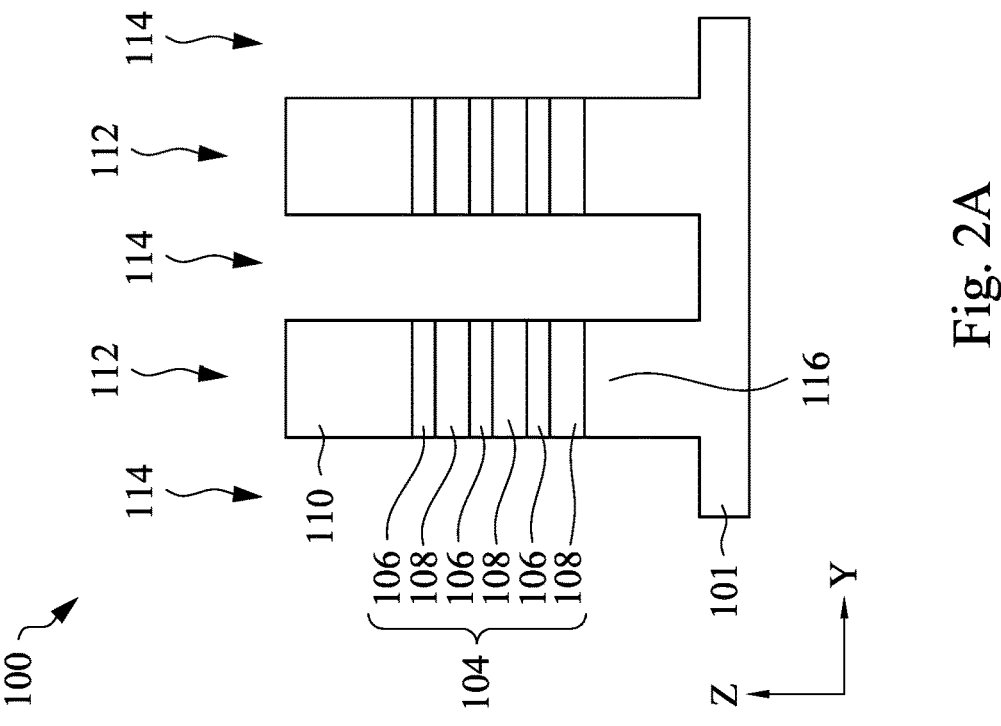

FIGS. 2A-2D are cross-sectional side views of various stages of manufacturing the semiconductor device structure 100 taken along line A-A of FIG. 1, in accordance with some embodiments. As shown in FIG. 2A, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer 110 formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer 110, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer 110, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

In FIG. 2B, after the fin structures 112 are formed, isolation regions 118 are formed on the substrate 101. The isolation regions 118 may be formed by first filling the trenches 114 between neighboring fin structures 112 with an insulating material. The insulating material is then recessed to form isolation regions 118. The recess of the insulating material exposes portions of the fin structures 112, such as the stack of semiconductor layers 104. The recess of the insulating material reveals the trenches 114 between the neighboring fin structures 112. A top surface of the isolation region 118 may be level with or below a surface of the second semiconductor layers 108 in contact with the well portion 116 formed from the substrate 101. The isolation regions 118 may be made of silicon oxide, silicon nitride, silicon oxynitride (SiON), SiOCN, SiCN, fluorine-doped silicate glass (FSG), a low-K dielectric material, or any suitable dielectric material. The isolation regions 118 may be formed by any suitable method, such as low-pressure chemical vapor deposition (LPCVD), plasma enhanced CVD (PECVD) or flowable CVD (FCVD).

Figure 2D:
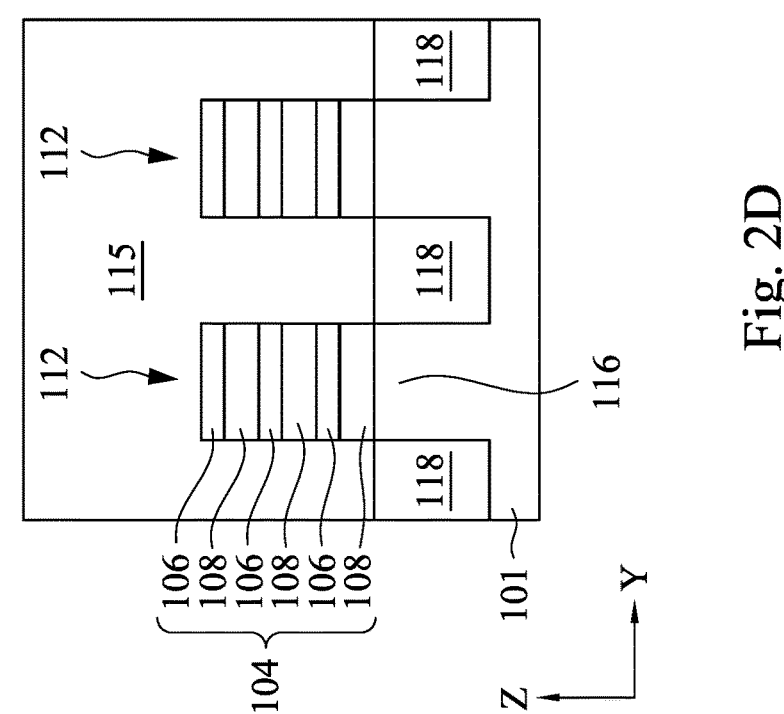
Figure 2C:
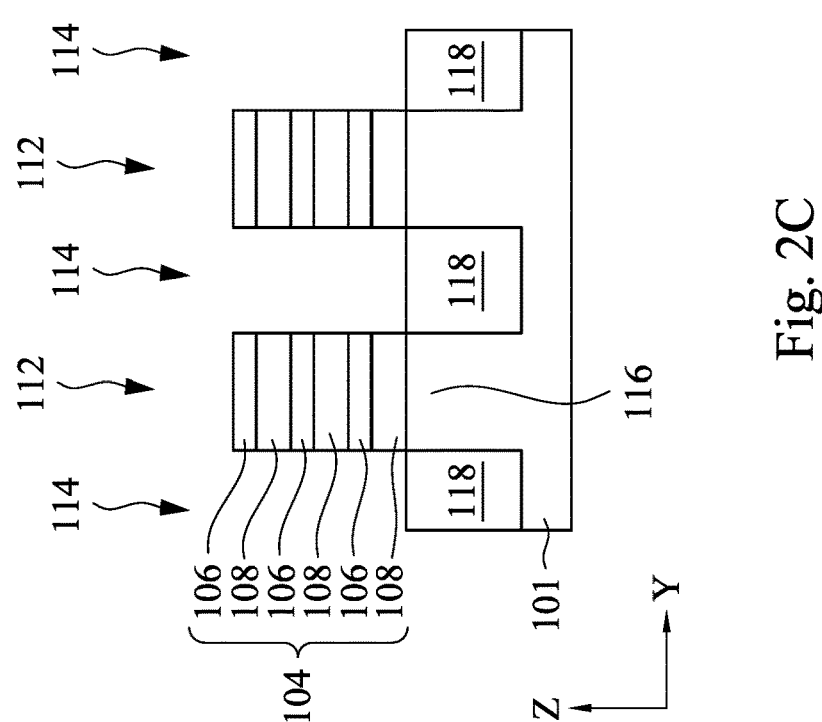

As shown in FIG. 2C, the hard mask layer 110 is removed. The hard mask layer 110 may be removed by a selective etch process that does not substantially affect the isolation regions 118 and the stack of semiconductor layers 104. As shown in FIG. 2D, a sacrificial gate material 115 is formed on the fin structures 112 and the isolation regions 118. A sacrificial gate dielectric layer (not shown) may be first formed on the fin structures 112 and the isolation regions 118, and the sacrificial gate material 115 is formed on the sacrificial gate dielectric layer.

Figure 3B:
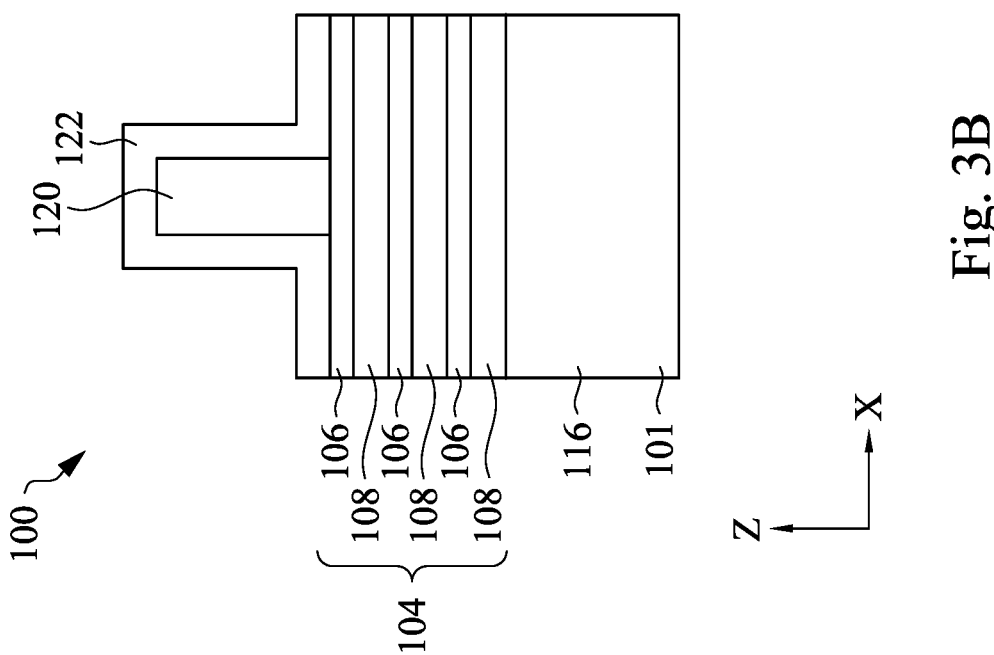
Figure 3A:
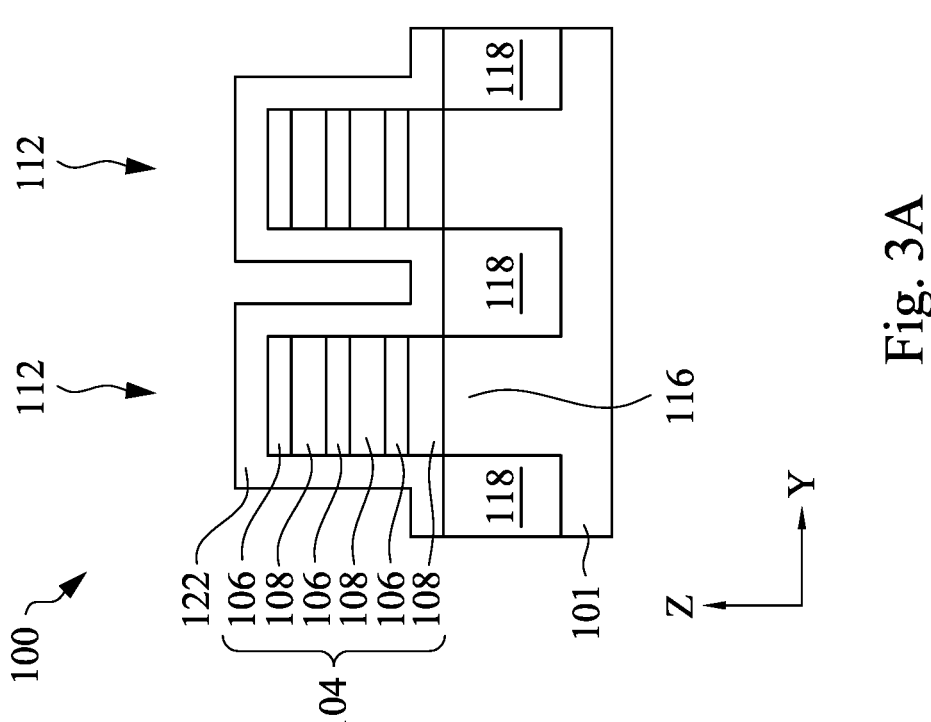

FIGS. 3A-11A are cross-sectional side views of various stages of manufacturing the semiconductor device structure 100 taken along line A-A of FIG. 1, in accordance with some embodiments. The line A-A illustrates a cross-section in the source/drain (S/D) regions. FIGS. 3B-11B are cross-sectional side views of various stages of manufacturing the semiconductor device structure 100 taken along line B-B of FIG. 1, in accordance with some embodiments. The line B-B illustrates a cross-section along a fin structure 112. As shown in FIGS. 3A and 3B, the one or more sacrificial gate electrodes 120 (only one is shown) are formed across one or more fin structures 112. The one or more sacrificial gate electrodes 120 may be formed by patterning the sacrificial gate material 115. The sacrificial gate dielectric layer may be also patterned along with the sacrificial gate material 115. In some embodiments, the sacrificial gate electrode 120 and the sacrificial gate dielectric layer together may form a sacrificial gate structure. Each sacrificial gate structure may be formed over a portion of the fin structures 112. While one sacrificial gate structure is shown, two or more sacrificial gate structures may be arranged along the X direction in some embodiments.

In some embodiments, a mask layer (not shown) may be formed on the sacrificial gate electrode 120, and the mask layer is part of the sacrificial gate structure. The sacrificial gate dielectric layer may include one or more layers of dielectric material, such as a silicon oxide-based material. The sacrificial gate electrode 120 may include silicon such as polycrystalline silicon or amorphous silicon. The mask layer may include more than one layer, such as an oxide layer and a nitride layer.

As shown in FIGS. 3A and 3B, gate spacers 122 are then formed on the sacrificial gate structures and the exposed portions of the fin structures 112. The gate spacers 122 may one or more conformal layers. The gate spacer 122 may be made of a dielectric material such as silicon oxide, silicon nitride, silicon carbide, silicon oxynitride, SiCN, silicon oxycarbide, SiOCN, and/or combinations thereof.

Figure 4B:
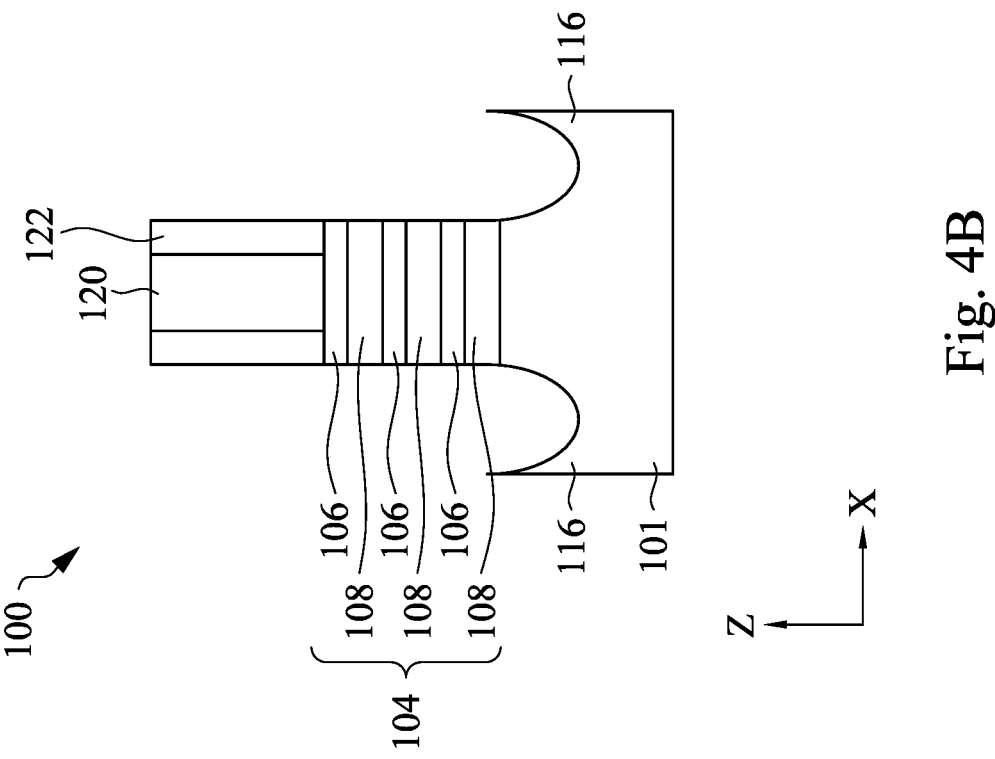
Figure 4A:
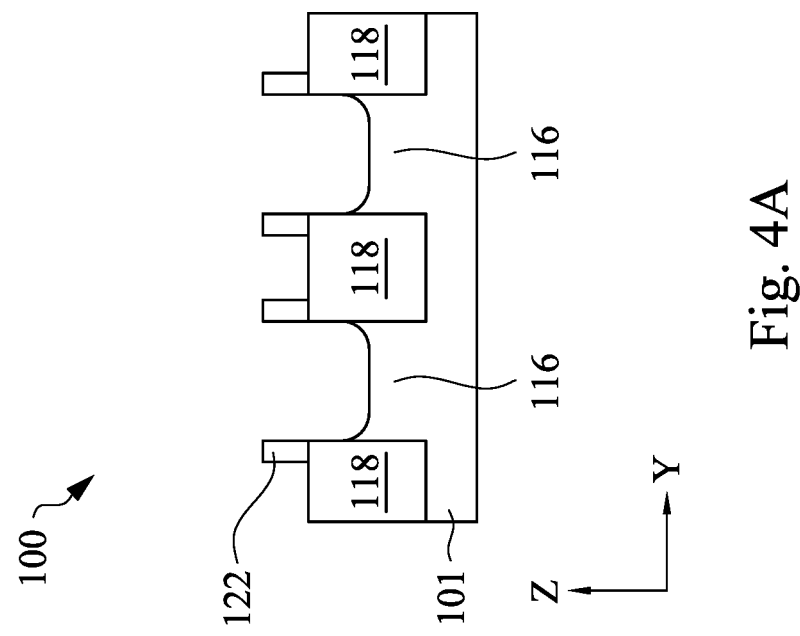

Next, as shown in FIGS. 4A and 4B, an anisotropically etch process is performed to remove portions of the gate spacers 122 formed on horizontal surfaces, and the exposed portions of the fin structures 112 not covered by the sacrificial gate structures are recessed. The portions of the fin structures 112 that are covered by the sacrificial gate electrode 120 of the sacrificial gate structure serve as channel regions for the semiconductor device structure 100.

The portions of the fin structures 112 not covered by the sacrificial gate structure and the gate spacers 122 are recessed to a level above, at, or below the top surfaces of the isolation regions 118. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH4OH), or any suitable etchant. After recessing the exposed portion of each fin structure 112, a portion of each well portion 116 is exposed.

Figure 5B:
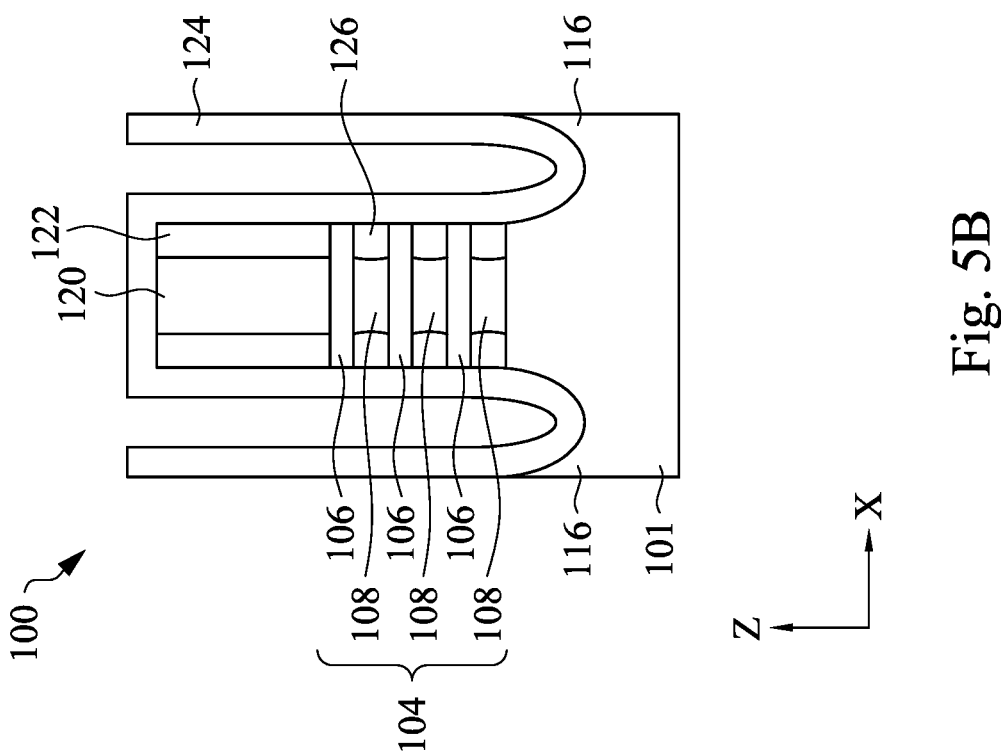
Figure 5A:
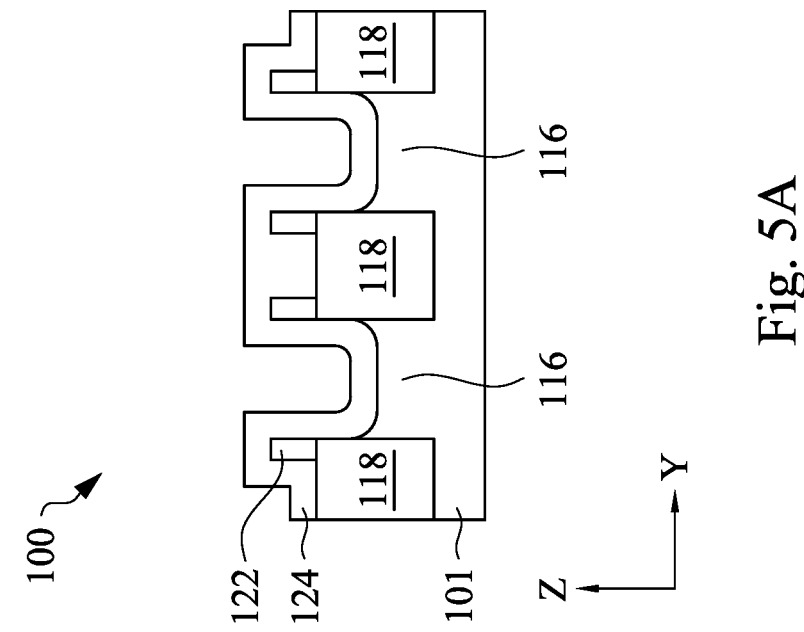

Next, as shown in FIGS. 5A and 5B, edge portions of each second semiconductor layer 108 of the stack of semiconductor layers 104 are removed horizontally along the X direction, and a dielectric layer 124 is deposited on the exposed surfaces of the semiconductor device structure 100. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH4OH), tetramethylammonium hydroxide (TMAH), ethylenediamine pyrocatechol (EDP), or potassium hydroxide (KOH) solutions.

The dielectric layer 124 may be made of a dielectric material, such as SiON, SiCN, SiOC, SiOCN, SiN, SIO2, AlO, or HfO. In some embodiments, the dielectric material is a low-K dielectric material (with K value less than 7). In some embodiments, the dielectric material is a high-K dielectric material (with K value greater than or equal to 7). The dielectric layer 124 may be formed by a conformal deposition process, such as ALD. Portions of the dielectric layer 124 formed in the cavities created by the removal of the edge portions of the second semiconductor layers 108 may be dielectric spacers 126, as shown in FIG. 5B.

Figure 6B:
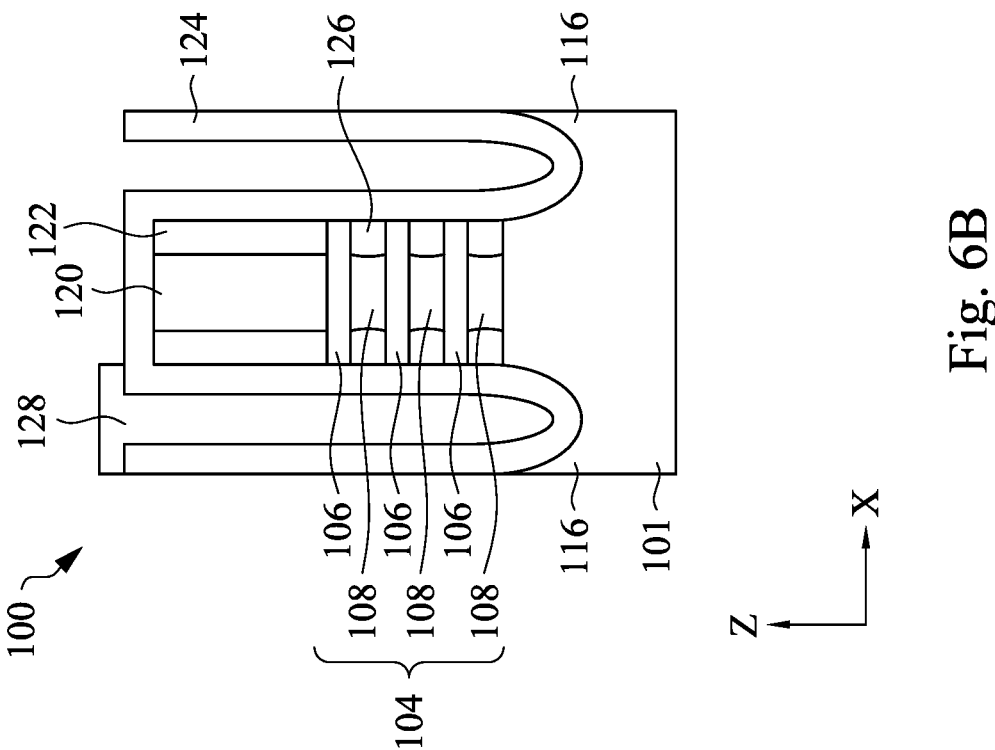
Figure 6A:
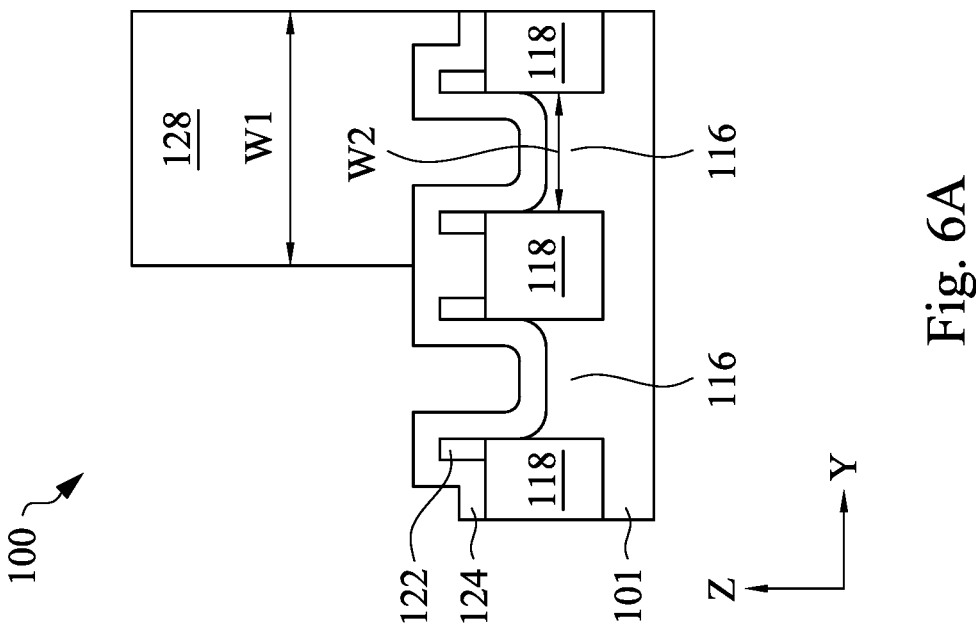

As shown in FIGS. 6A and 6B, a mask layer 128 is formed on a portion of the dielectric layer 124 disposed on one of the well portions 116. The mask layer 128 may include any suitable material. In some embodiments, the mask layer 128 is a bottom anti-reflective coating (BARC). The mask layer 128 may have a width W1 substantially greater than a width W2 of the well portion 116 disposed therebelow. In some embodiments, the mask layer 128 covers portions of the dielectric layer 124 disposed over multiple well portions 116.

Figure 7B:
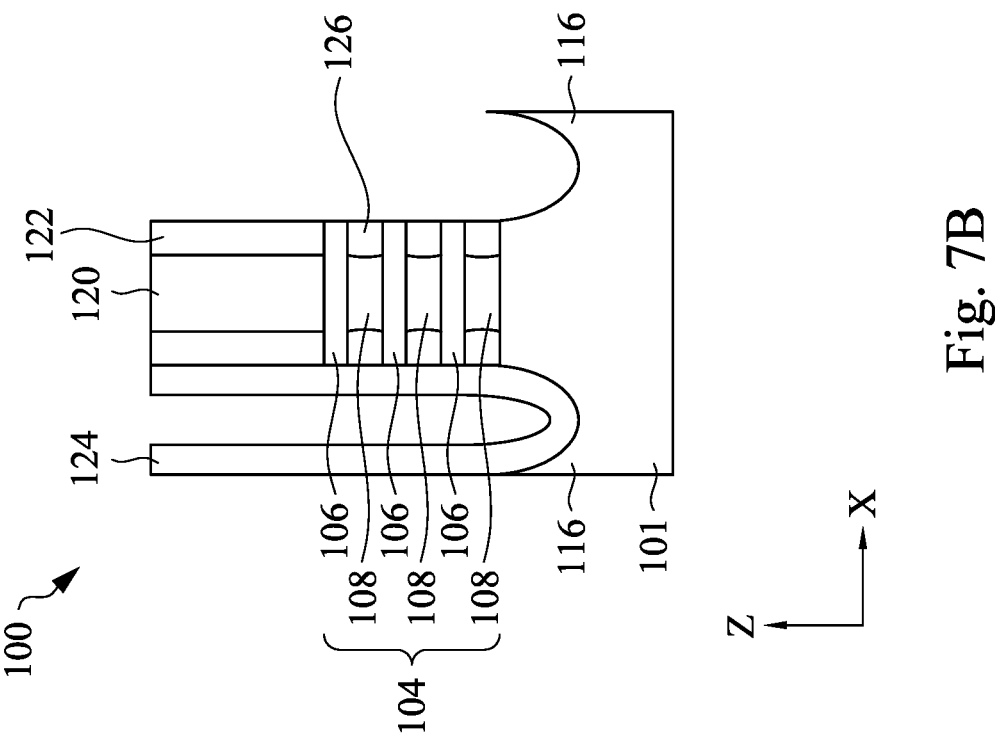
Figure 7A:
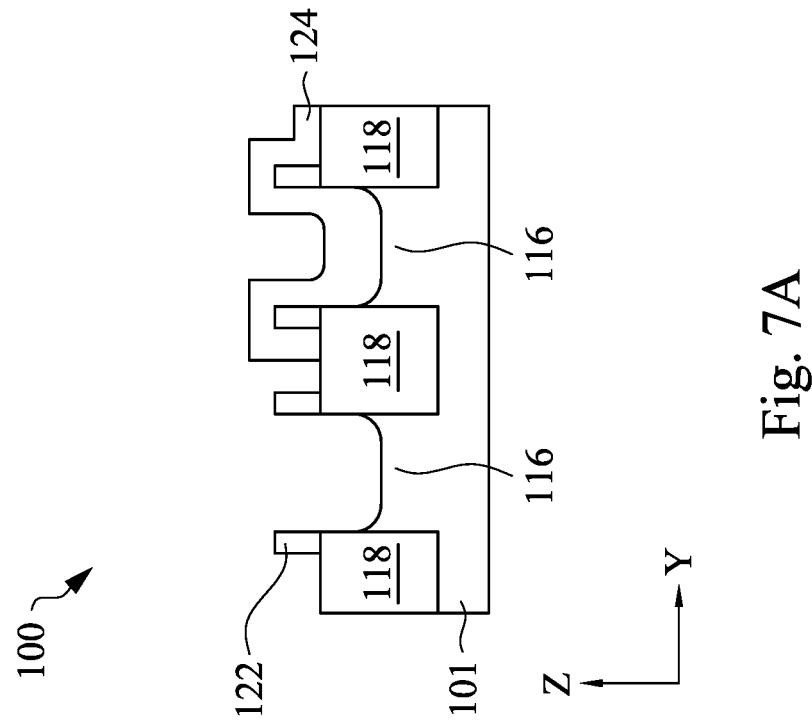

As shown in FIGS. 7A and 7B, the exposed portion of the dielectric layer 124 not covered by the mask layer 128 is removed, and then the mask layer 128 is removed. The exposed portion of the dielectric layer 124 may be removed by an anisotropic etch process. As a result, the dielectric spacers 126 are not removed because the dielectric spacers 126 are protected by the first semiconductor layers 106 during the anisotropic etching process. The remaining second semiconductor layers 108 are capped between the dielectric spacers 126 along the X direction. The mask layer 128 may be removed by any suitable process. The process to remove the mask layer 128 does not substantially affect the dielectric layer 124, the sacrificial gate electrode 120 (or the mask layer formed thereon), and the gate spacers 122.

The portion of the dielectric layer 124 covered by the mask layer 128 remains on the exposed portion of one of the well portions 116, as shown in FIGS. 7A and 7B. The remaining portion of the dielectric layer 124 functions to prevent the growth of an epitaxial feature from the well portion 116, and a dielectric dummy source/drain (S/D) structure may be subsequently formed over the well portion 116 instead of an epitaxial feature. In some applications, such as SRAM cell or other circuits, the pull-up transistor may include the dielectric dummy S/D structure for reasons such as junction isolation or prevention of poly on OD edge (PODE) bottom epitaxial feature bridge.

Figure 8B:
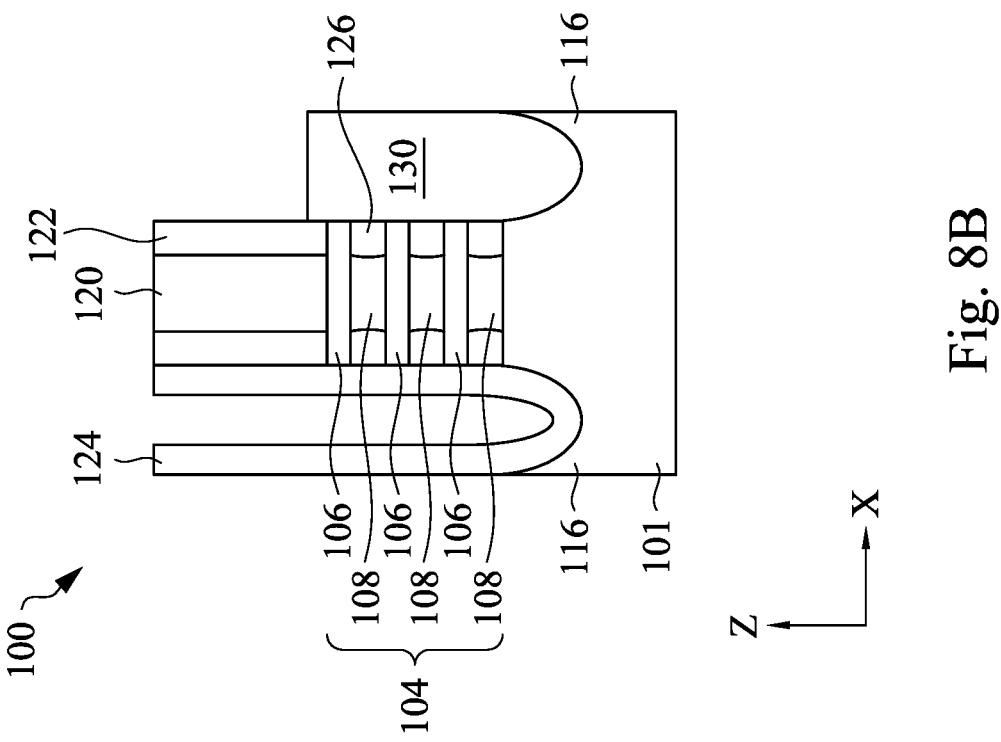
Figure 8A:
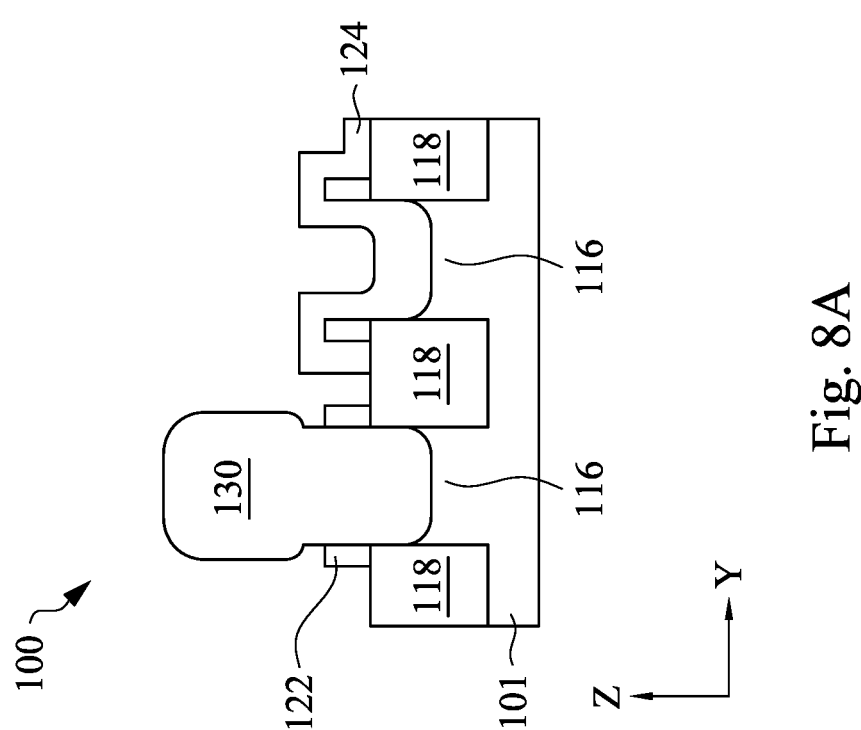

Next, as shown in FIGS. 8A and 8B, a first mask layer (not shown) is formed on the exposed surface of the semiconductor device structure 100, and the first mask layer is then patterned to expose one or more well portions 116. An epitaxial feature 130 is formed on each of the exposed well portions 116, as shown in FIGS. 8A and 8B. In some embodiments, the epitaxial features 130 may be n-type epitaxial features for n-type FETs (NFETs) and may include one or more layers of Si, SiP, SiC and SiCP. In some embodiments, the epitaxial features 130 may be p-type epitaxial features for p-type FETs (PFETs) and may include one or more layers of Si, SiGe, and Ge. For PFETs, p-type dopants, such as boron (B), may also be included in the epitaxial features 130. In some embodiments, the epitaxial features 130 are n-type epitaxial features, and the p-type epitaxial features (not shown) are subsequently formed from the well portions 116 covered by the first mask layer. After the formation of the epitaxial features 130, a second mask layer is formed and patterned to cover the epitaxial features 130, the first mask layer is removed to expose well portions 116 disposed thereunder, and an epitaxial feature (not shown) is formed on each of the exposed well portions 116. The epitaxial feature (not shown) may be the opposite type of the epitaxial features 130. For example, if the epitaxial features 130 are n-type epitaxial features, the epitaxial features (not shown) are p-type epitaxial features. If the epitaxial features 130 are p-type epitaxial features, the epitaxial features (not shown) are n-type epitaxial features.

The epitaxial features 130 and the subsequently formed epitaxial features (not shown) may be S/D regions and may be formed by an epitaxial growth method using CVD, ALD or MBE. In this disclosure, a source region and a drain region are interchangeably used, and the structures thereof are substantially the same. Furthermore, S/D region(s) may refer to a source or a drain, individually or collectively dependent upon the context.

The dielectric layer 124 remains on one of the well portions 116 during the formation of the epitaxial features 130 and the subsequently formed epitaxial features. As a result, no epitaxial feature is formed on the well portion 116 covered by the dielectric layer 124. In some embodiments, multiple well portions 116 are covered by the dielectric layer 124, and no epitaxial features are formed on the multiple well portions 116 covered by the dielectric layer 124. The dielectric layer 124 covers one or more well portions 116 during the formation of n-type epitaxial features and p-type epitaxial features, so no epitaxial features can be grown from the one or more well portions 116 covered by the dielectric layer 124.

Figure 9B:
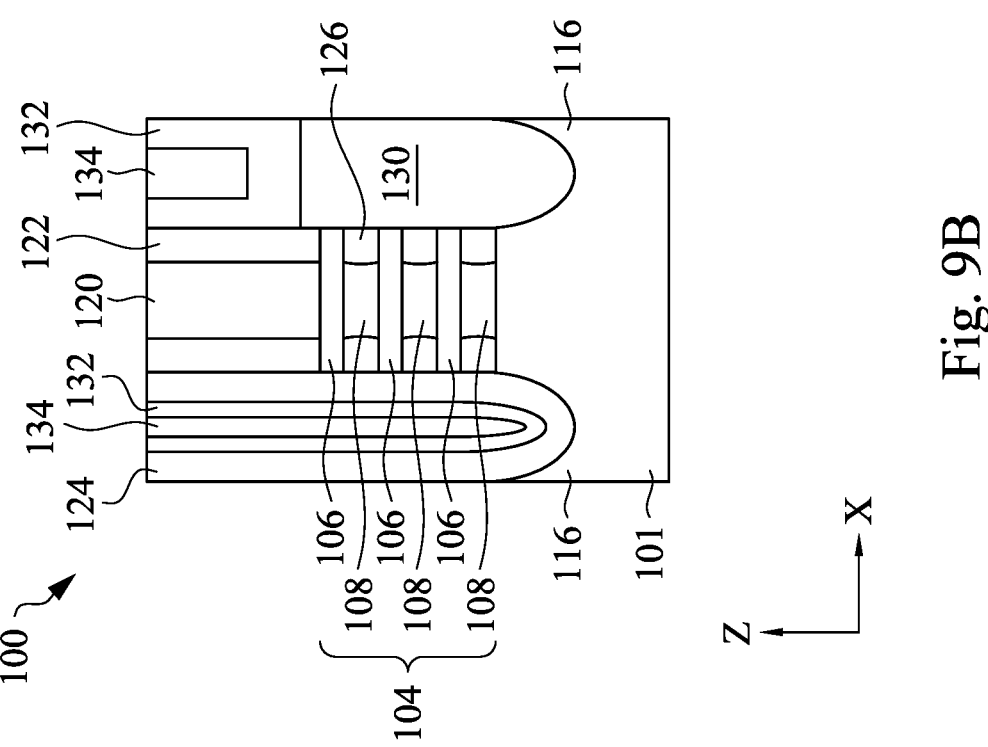
Figure 9A:
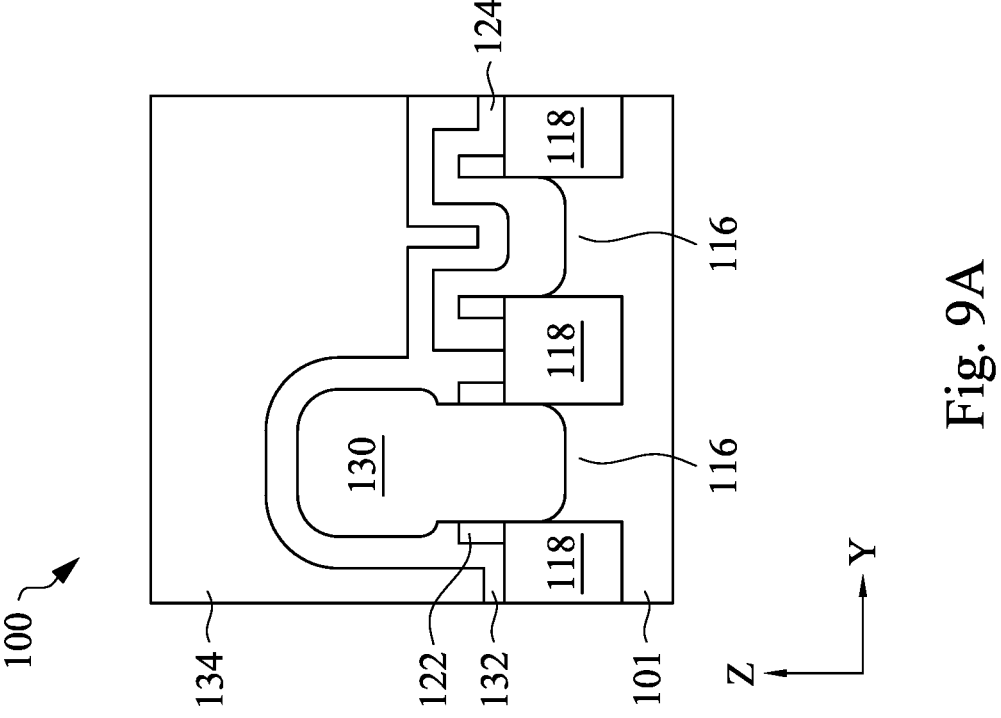

As shown in FIGS. 9A and 9B, a contact etch stop layer (CESL) 132 is conformally formed on the exposed surfaces of the semiconductor device structure 100. The CESL 132 covers the sidewalls of the sacrificial gate structure, the isolation regions 118, the epitaxial features 130 and the epitaxial features (not shown) that are opposite type as the epitaxial features 130, and the dielectric layer 124. The CESL 132 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 134 is formed on the CESL 132 over the semiconductor device structure 100. The materials for the ILD layer 134 may include compounds including Si, O, C, and/or H, such as silicon oxide, SiCOH, or SiOC. Organic materials, such as polymers, may also be used for the ILD layer 134. The ILD layer 134 may be deposited by a PECVD process or other suitable deposition technique. In some embodiments, after formation of the ILD layer 134, the semiconductor device structure 100 may be subject to a thermal process to anneal the ILD layer 134.

After the ILD layer 164 is formed, a planarization operation, such as CMP, is performed on the semiconductor device structure 100 until the sacrificial gate electrode 120 is exposed, as shown in FIGS. 9A and 9B.

Figure 10B:
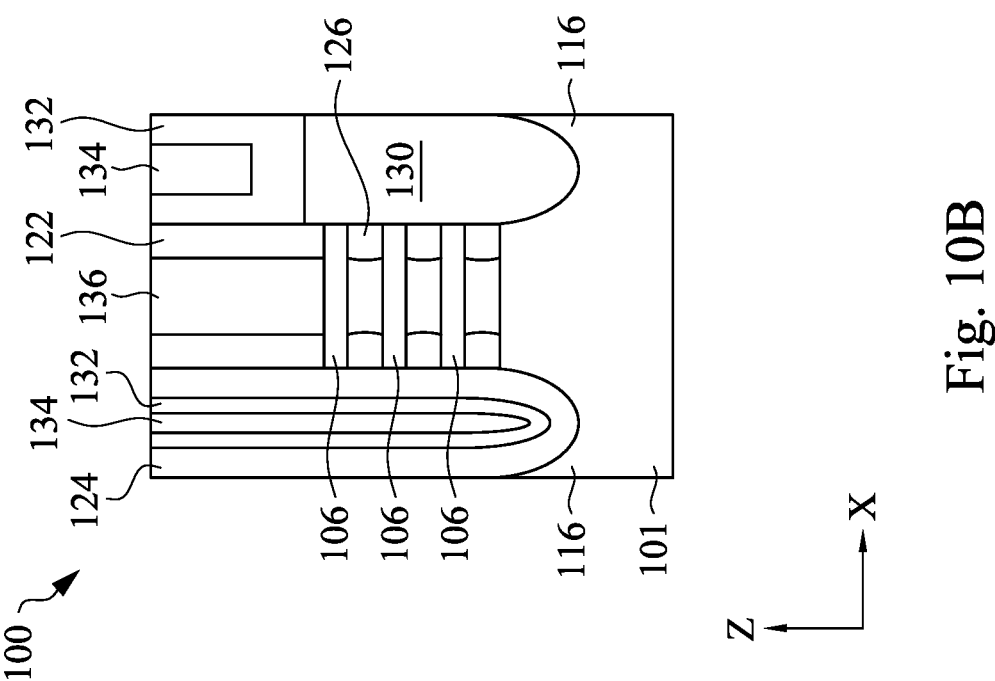
Figure 10A:
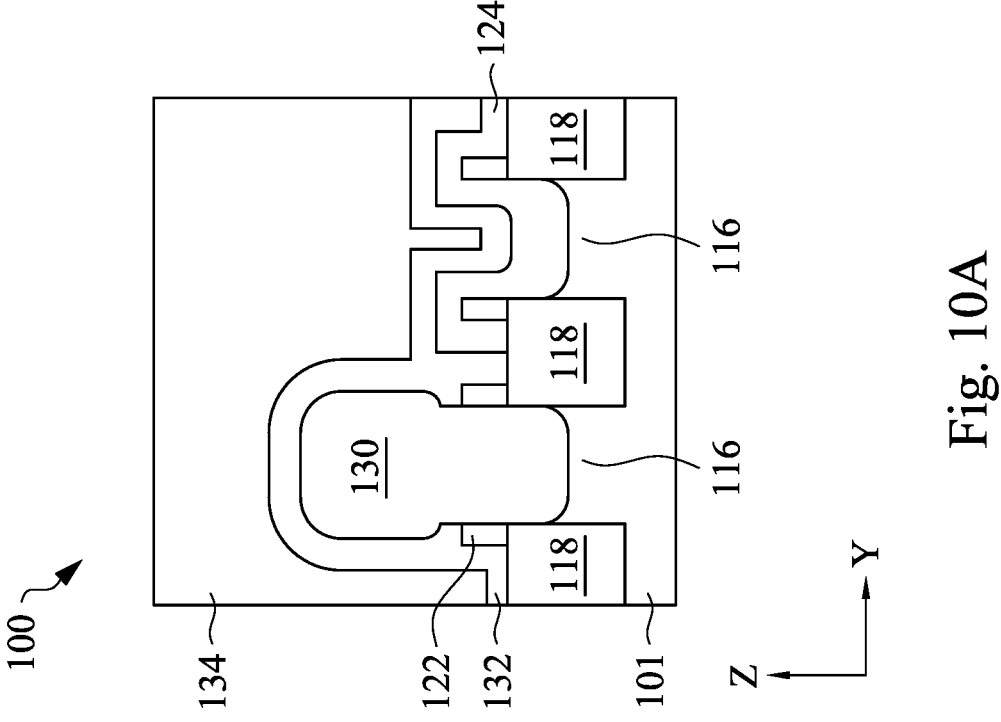

As shown in FIGS. 10A and 10B, the sacrificial gate structure and the second semiconductor layers 108 are removed. The removal of the sacrificial gate structure and the semiconductor layers 108 forms an opening between gate spacers 122 and between first semiconductor layers 106. The ILD layer 134 protects the epitaxial features 130 during the removal processes. The sacrificial gate structure can be removed using plasma dry etching and/or wet etching. The sacrificial gate electrode 120 may be first removed by any suitable process, such as dry etch, wet etch, or a combination thereof, followed by the removal of the sacrificial gate dielectric layer, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode 120 but not the gate spacers 122, the dielectric layer 124, the ILD layer 134, and the CESL 132.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 122, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer (not shown) is formed to surround the exposed portions of the first semiconductor layers 106, and a gate electrode 136 is formed on the gate dielectric layer. The gate dielectric layer and the gate electrode 136 may be collectively referred to as a gate structure. In some embodiments, an interfacial layer (IL) (not shown) is formed between the gate dielectric layer and the exposed surfaces of the first semiconductor layers 106. In some embodiments, the gate dielectric layer includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer may be formed by CVD, ALD or any suitable deposition technique. The gate electrode 136 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode 136 may be formed by CVD, ALD, electro-plating, or other suitable deposition technique. The gate electrode 136 may be also deposited over the upper surface of the ILD layer 134. The gate dielectric layer and the gate electrode 136 formed over the ILD layer 134 are then removed by using, for example, CMP, until the top surface of the ILD layer 134 is exposed.

In some embodiments, as shown in FIG. 10B, one or more first semiconductor layers 106 are nanostructure channels surrounded by the gate electrode 136. The epitaxial feature 130, which is a source or a drain region, is electrically connected to a first end of the one or more first semiconductor layers 106. In some embodiments, the epitaxial feature 130 is in contact with the first end of the one or more first semiconductor layers 106. The dielectric layer 124 is in contact with a second end of the one or more first semiconductor layers 106. The second end is opposite of the first end. In some embodiments, the dielectric layer 124 may have a "U" shaped cross-section, the CESL 132 is disposed on and surrounded by the dielectric layer 124, and the ILD layer 134 is disposed on and surrounded by the CESL 132. The dielectric layer 124, the CESL 132, and the ILD layer 134 disposed adjacent the second end of the one or more first semiconductor layers 106 may form a dielectric dummy S/D structure, which may be formed for the purpose of junction isolation or prevention of PODE bottom epitaxial feature bridge.

Figure 11B:
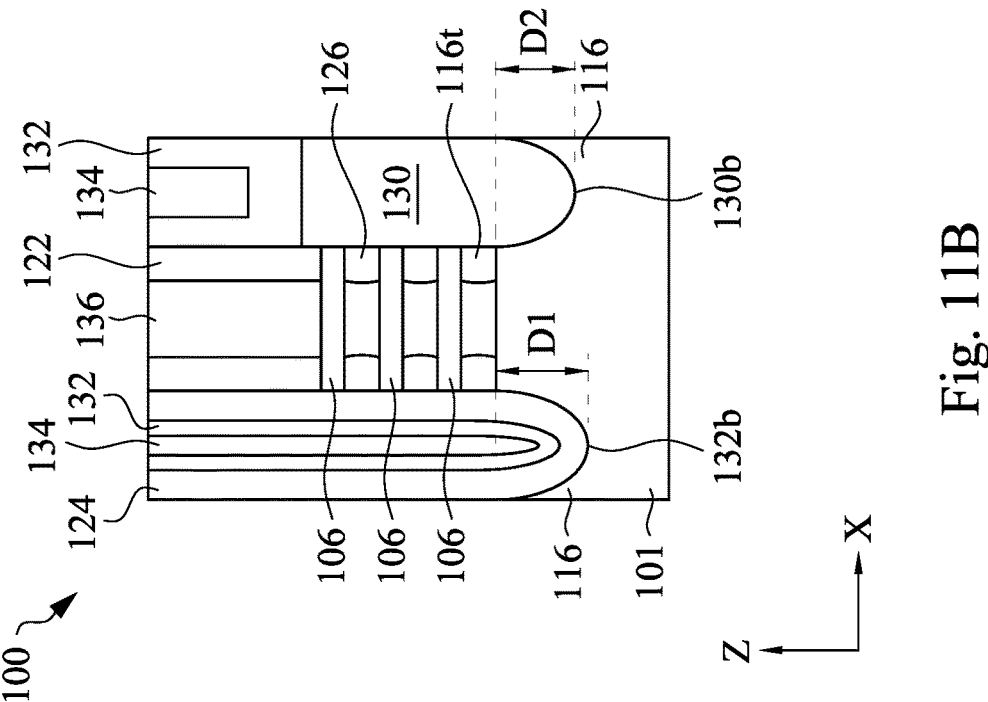
Figure 11A:
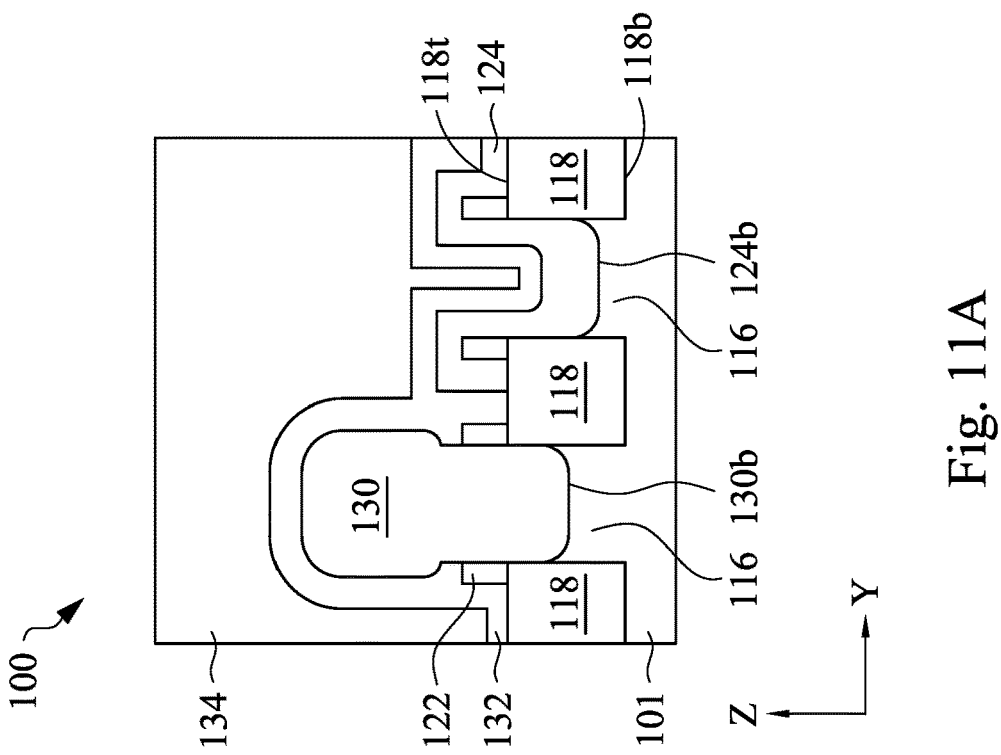

In some embodiments, the bottom of the dielectric layer 124 is at the same level as the bottom of the epitaxial feature 130, as shown in FIGS. 10A and 10B. In some embodiments, the bottom 124b of the dielectric layer 124 is at a level below the level of the bottom 130b of the epitaxial feature 130, such as about 5 nm to about 30 nm below the level of the bottom 130b, as shown in FIGS. 11A and 11B. The bottom 124b and the bottom 130b located at different levels may be achieved by adding another mask during the recess of the stack of semiconductor layers 104 as described in FIGS. 4A and 4B. The mask exposes the well portion 116 that the dielectric layer 124 to be formed thereon, and the exposed well portion 116 is further recessed to a level below the level of other well portions 116. In some embodiments, the bottom 124b is located at a level between a top 118t and a bottom 118b of the isolation region 118. In some embodiments, the bottom 124b is located at the same level as the bottom 118b. In some embodiments, the bottom 124b is located at a level below the level of the bottom 118b. The lower level of the bottom 124b relative to the level of the bottom 130b of the epitaxial feature 130 may help to further improve junction isolation or to prevent PODE bottom epitaxial feature bridge.

As shown in FIG. 11B, the bottom 124b is a distance D1 away from the level of the top surface 116t of the well portion 116 that the gate electrode 136 is disposed thereover. The bottom 130b is a distance D2 away from the level of the top surface 116t. In some embodiments, the distance D1 is substantially the same as the distance D2, as shown in FIG. 10B. For example, both distances D1, D2 may range from about 30 nm to about 100 nm. In some embodiments, the distance D1 ranges from about 80 nm to about 200 nm and is substantially greater than the distance D2, such as about 5 nm to about 30 nm greater than the distance D2.

Figure 12:
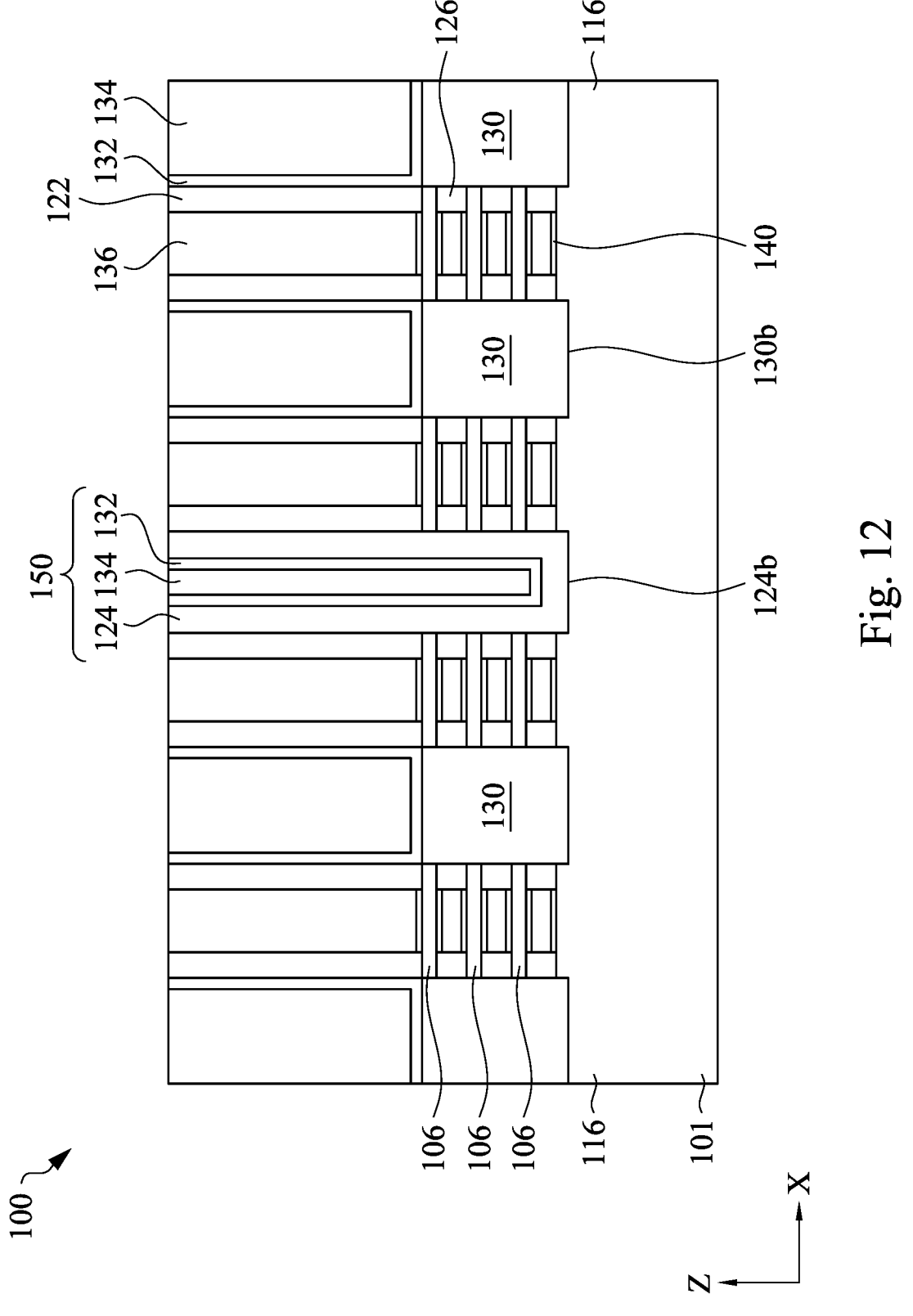
FIGS. 12-14 are cross-sectional side views of one of various stages of manufacturing the semiconductor device structure taken along line B-B of FIG. 1, in accordance with alternative embodiments.
Figure 13:
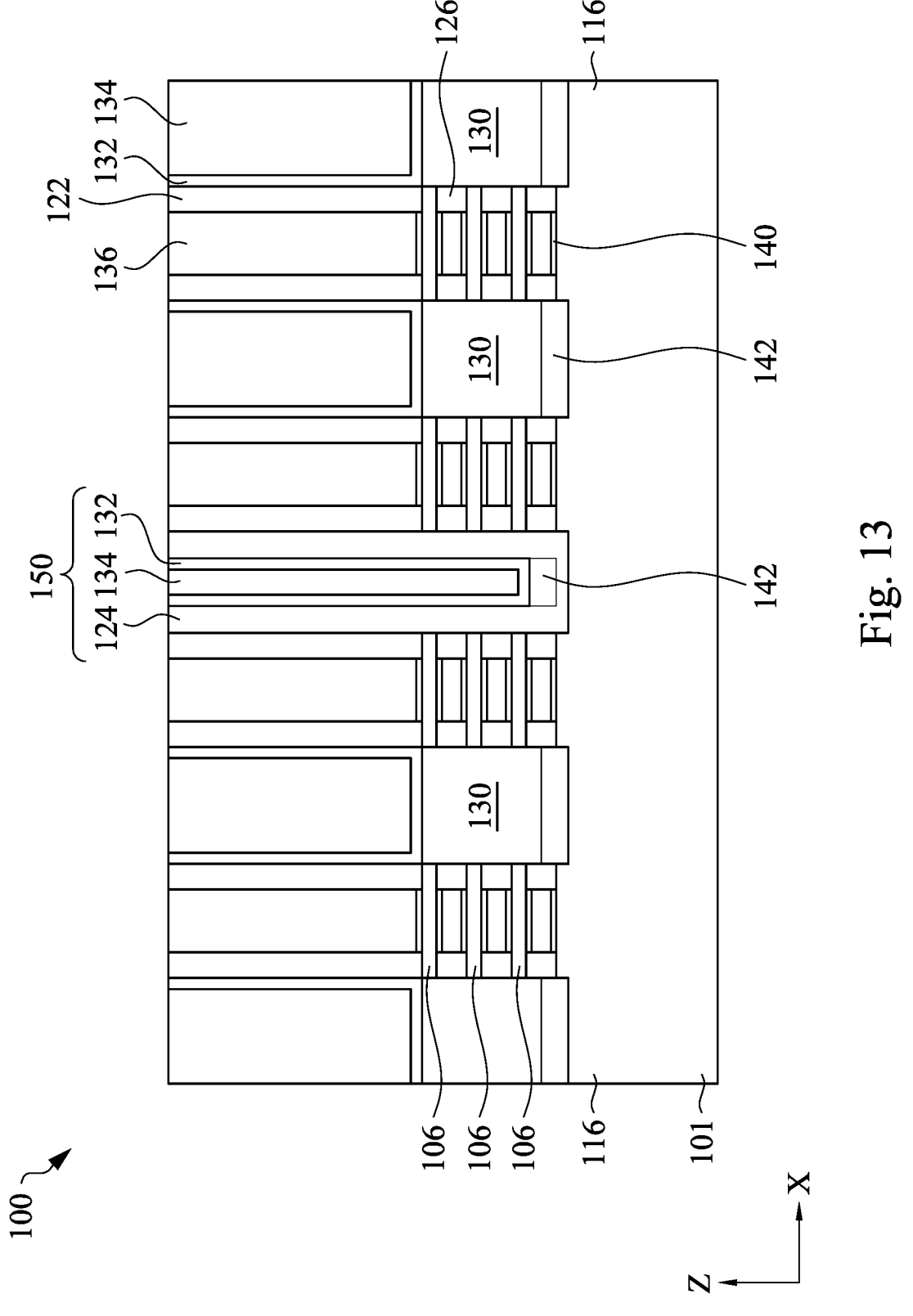
Figure 14:
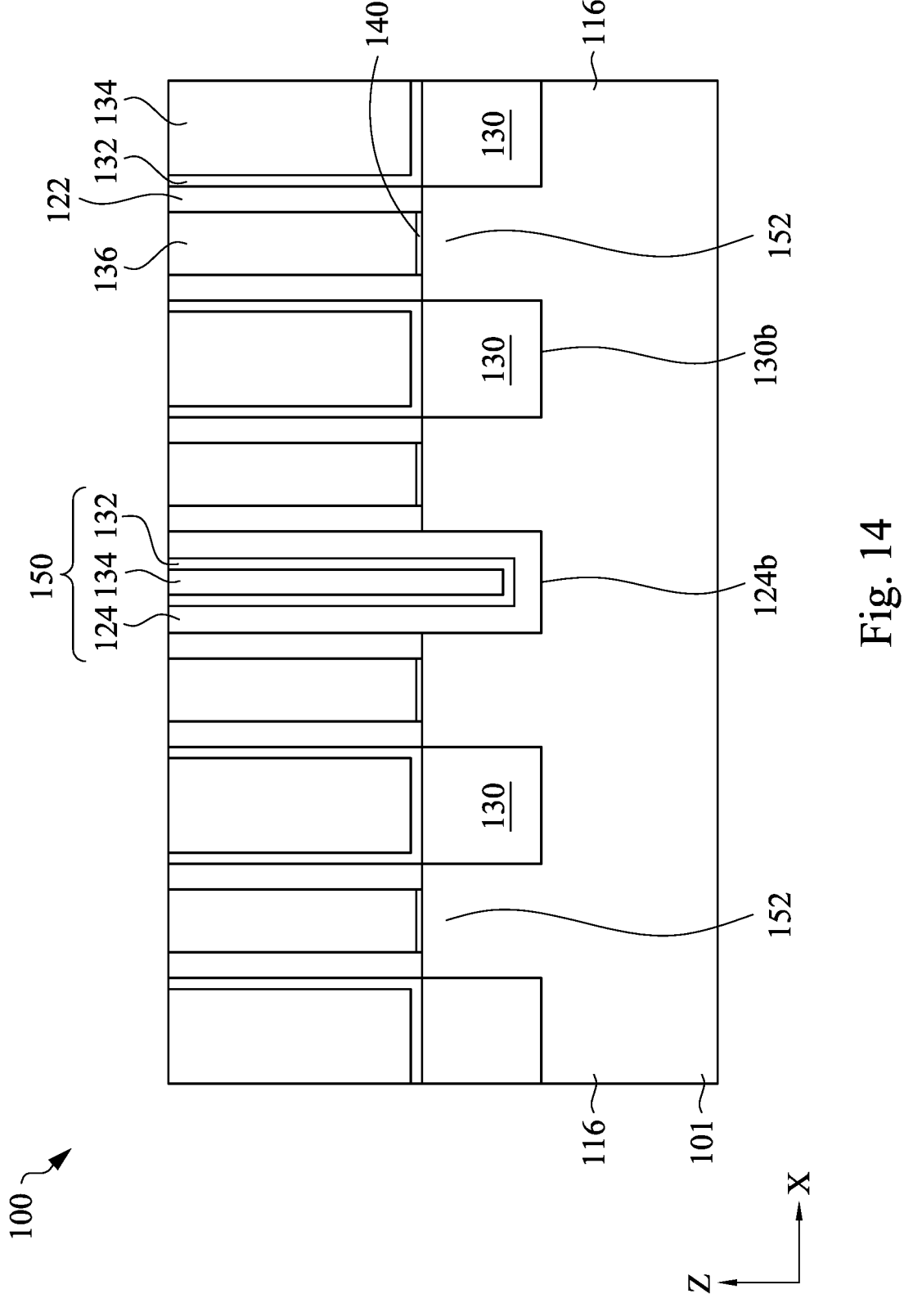

FIGS. 12-14 are cross-sectional side views of one of various stages of manufacturing the semiconductor device structure 100 taken along line B-B of FIG. 1, in accordance with alternative embodiments. As shown in FIG. 12, multiple gate electrodes 136 are disposed over the substrate 101. An IL 140 may be formed on the first semiconductor layers 106, the gate dielectric layer (not shown) is formed on the IL 140, and the gate electrode 136 is formed on the gate dielectric layer. As shown in FIG. 12, a dielectric dummy S/D structure 150 may be formed over the substrate 101 instead of an epitaxial feature. The dielectric dummy S/D structure 150 includes the dielectric layer 124, the CESL 132, and the ILD layer 134. The dielectric dummy S/D structure 150 may be disposed between adjacent gate electrodes 136 and between adjacent pluralities of first semiconductor layers 106. In some embodiments, the top surface of the dielectric layer 124 may be substantially coplanar with a top surface of the ILD layer 134 disposed over the epitaxial features 130. In some embodiments, the top surface of the dielectric layer 124 may be substantially coplanar with a top surface of the gate electrode 136. The dielectric layer 124 extends from a first level to a second level. The first level may be the level of the top surface of the ILD layer 134, and the second level may be the level of the bottom 130b of the epitaxial feature 130. In some embodiments, the second level may be below the level of the bottom 130b of the epitaxial feature 130.

In some embodiments, a dielectric layer 142 is formed on the well portion 116, and the epitaxial features 130 are formed on the dielectric layer 142, as shown in FIG. 13. The epitaxial features 130 may be formed by growing from the first semiconductor layers 106. The dielectric layer 142 may be formed at stage after the processes described in FIGS. 7A and 7B. The dielectric layer 142 may include any suitable dielectric material, such as a nitride. For example, a dielectric layer may be conformally formed on the exposed surfaces of the semiconductor device structure 100 shown in FIGS. 7A and 7B. An etch back process may be performed on the dielectric layer to form the dielectric layer 142. The dielectric layer 142 may be formed on the dielectric layer 124, and the CESL 132 is formed on the dielectric layer 142, as shown in FIG. 13. In some embodiments, the dielectric dummy S/D structure 150 includes the dielectric layer 124, the dielectric layer 142, the CESL 132, and the ILD layer 134.

In some embodiments, the semiconductor device structure 100 includes FinFETs instead of nanostructure channel FETs, as shown in FIG. 14. Instead of having one or more first semiconductor layers 106 as channel regions, each FinFET includes a channel region 152 disposed between adjacent epitaxial features 130 and between the dielectric dummy S/D structure 150 and the epitaxial features 130. The channel region 152 may include the same material as the substrate 101 or the well portion 116. The IL 140 may be formed on the channel region 152, the gate dielectric layer (not shown) may be formed on the IL 140, and the gate electrode 136 is formed on the gate dielectric layer.

Figure 15B:
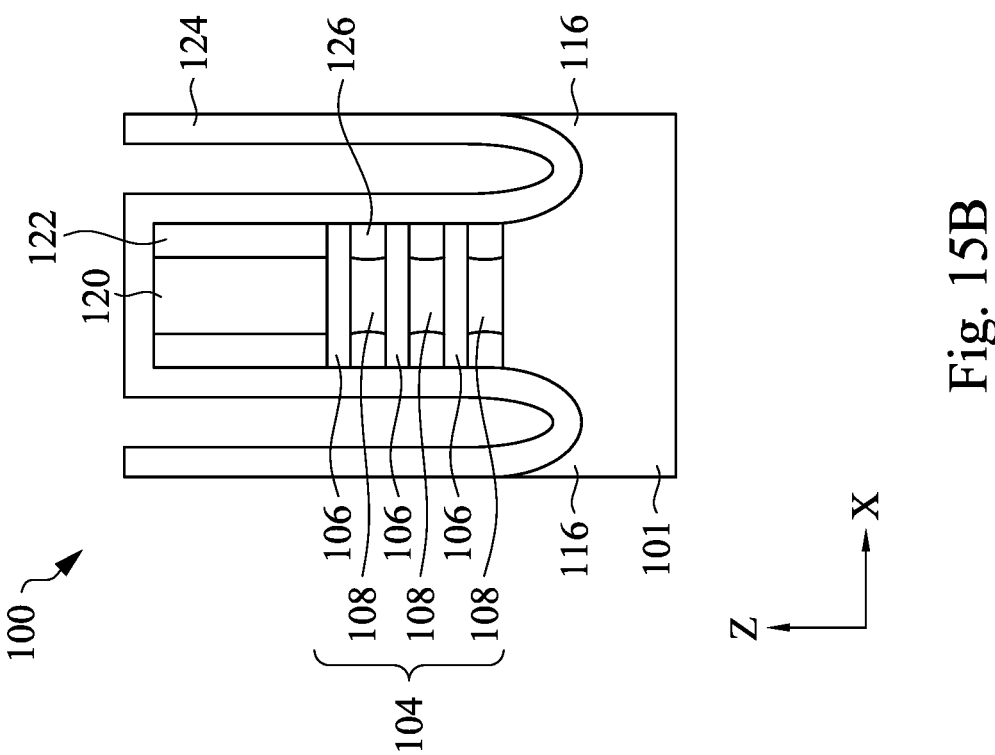
Figure 15A:
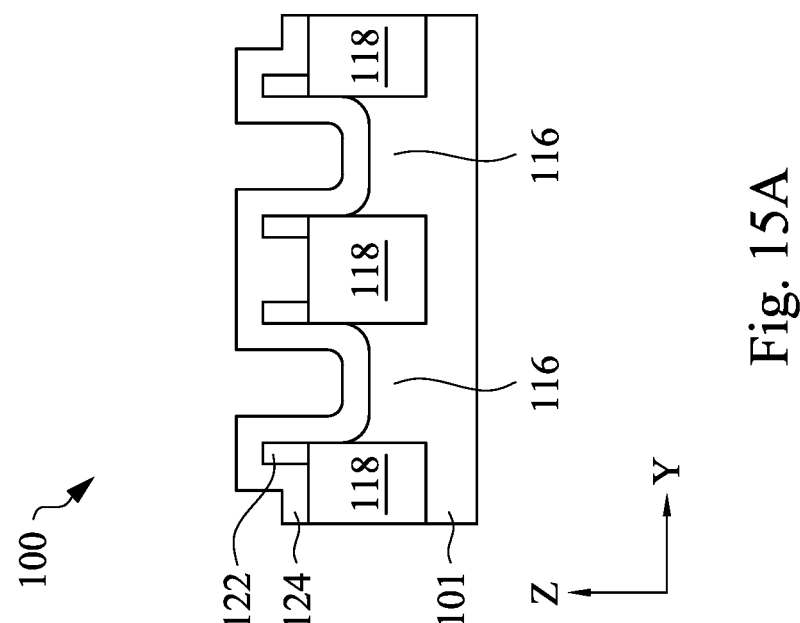
Figure 16B:
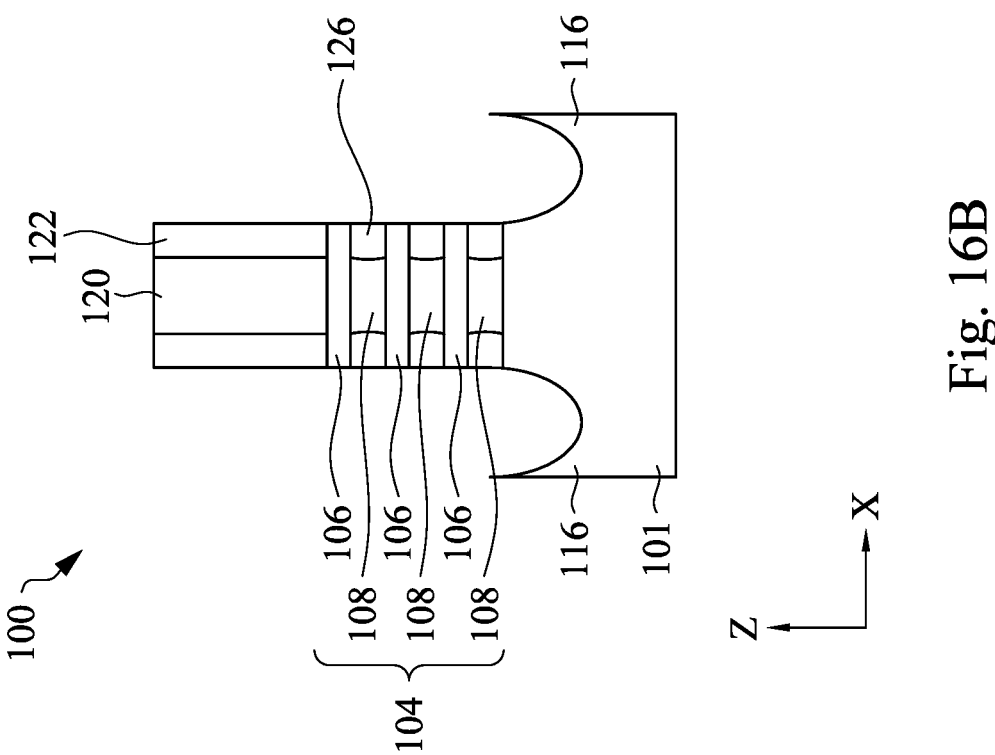
Figure 16A:
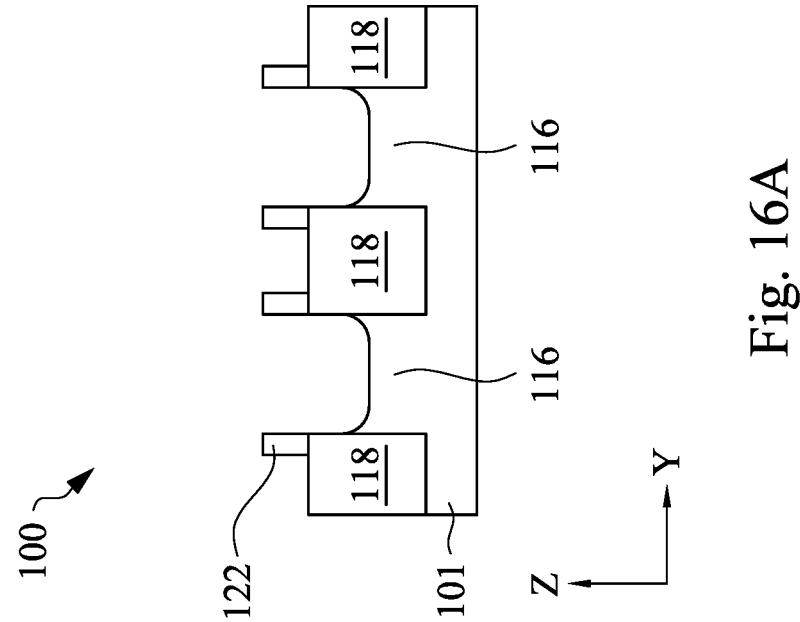

FIGS. 15A-23A are cross-sectional side views of various stages of manufacturing the semiconductor device structure 100 taken along line A-A of FIG. 1, in accordance with alternative embodiments. FIGS. 15B-23B are cross-sectional side views of various stages of manufacturing the semiconductor device structure 100 taken along line B-B of FIG. 1, in accordance with alternative embodiments. As shown in FIGS. 15A and 15B, which is at the same stage as in FIGS. 5A and 5B, the dielectric layer 124 is formed on the exposed surfaces of the semiconductor device structure 100 and in the cavities created by the removal of the edge portions of the second semiconductor layers 108. Next, as shown in FIGS. 16A and 16B, the dielectric layer 124 is removed by an anisotropic etch process, and the dielectric spacers 126 remains. The well portions 116 are exposed.

Figure 17B:
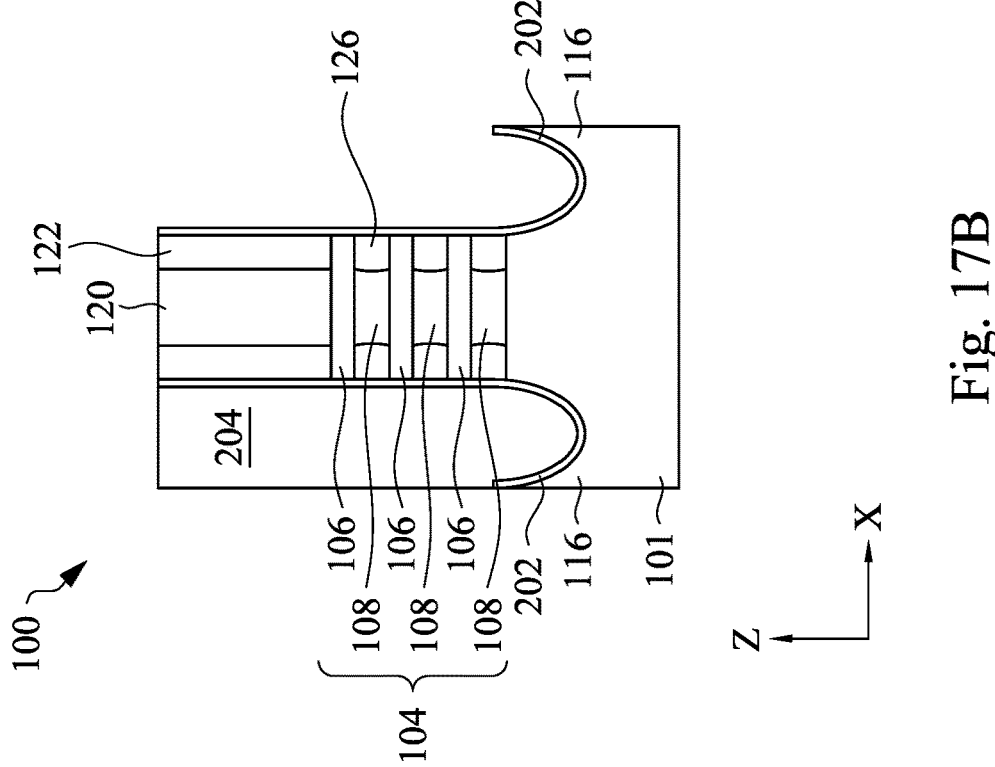
Figure 17A:
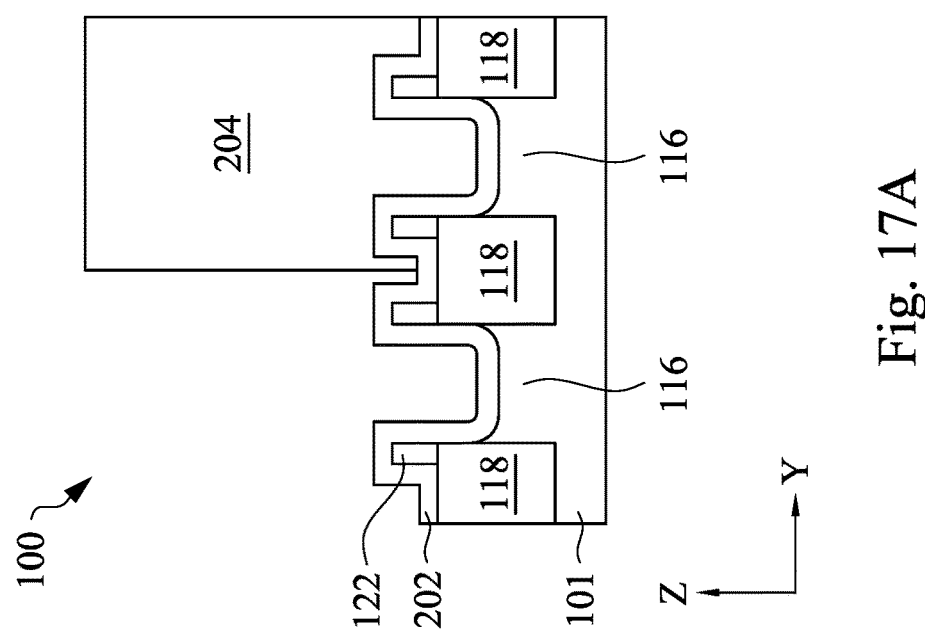

As shown in FIGS. 17A and 17B, a hard mask layer 202 is formed on the exposed surfaces of the semiconductor device structure 100, and a mask layer 204 is formed on a portion of the hard mask layer 202. The hard mask layer 202 may include any suitable material, such as SiN. The mask layer 204 may include the same material as the mask layer 128 (FIGS. 6A and 6B) and may be formed by the same process as the mask layer 128. The mask layer 204 covers portions of the hard mask layer 202 that is disposed over multiple well portions 116. In some embodiments, the mask layer 204 is disposed over not only the well portion 116 that a dielectric dummy S/D structure 250 (FIG. 21B) will subsequently form thereon but also the well portions 116 that epitaxial features, such as the epitaxial features that are opposite type of the epitaxial features 130 (FIGS. 18A and 18B), will subsequently form thereon.

Figure 18B:
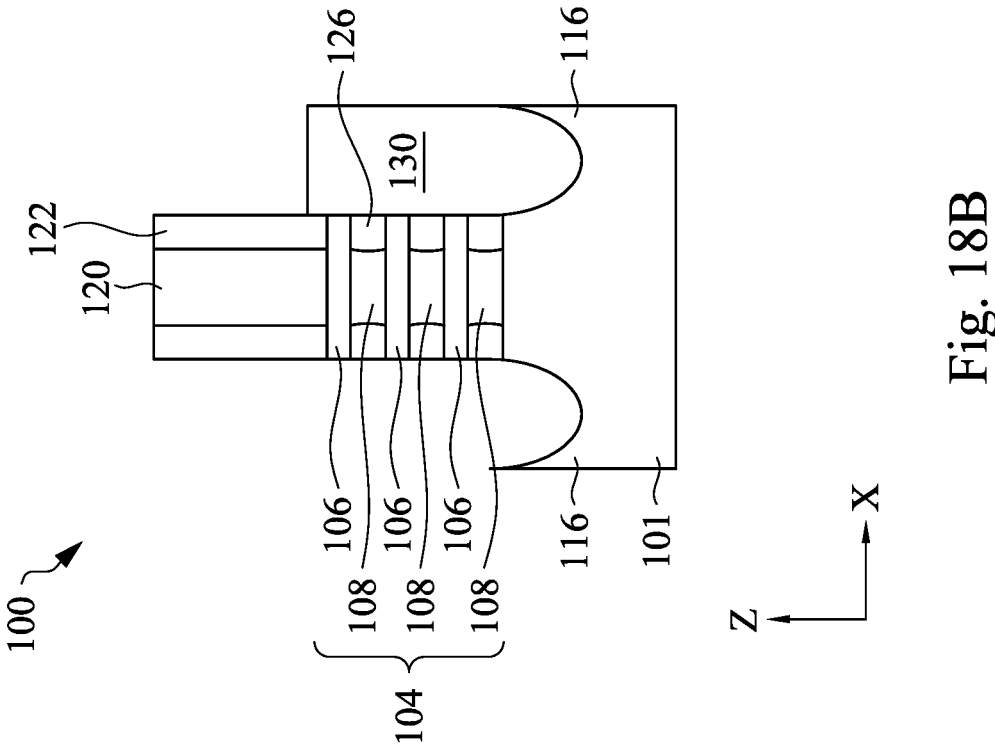
Figure 18A:
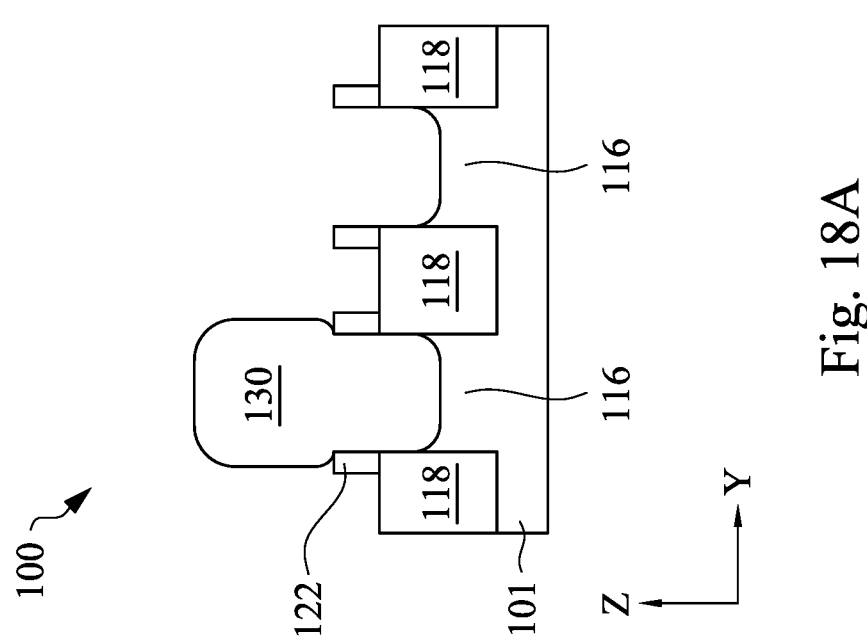

Next, as shown in FIGS. 18A and 18B, the exposed portion of the hard mask layer 202 not covered by the mask layer 204 is removed to expose the well portions 116 disposed thereunder, the epitaxial features 130 are formed on the exposed well portions 116, and the mask layer 204 and the hard mask layer 202 disposed thereunder are removed.

Figure 19B:
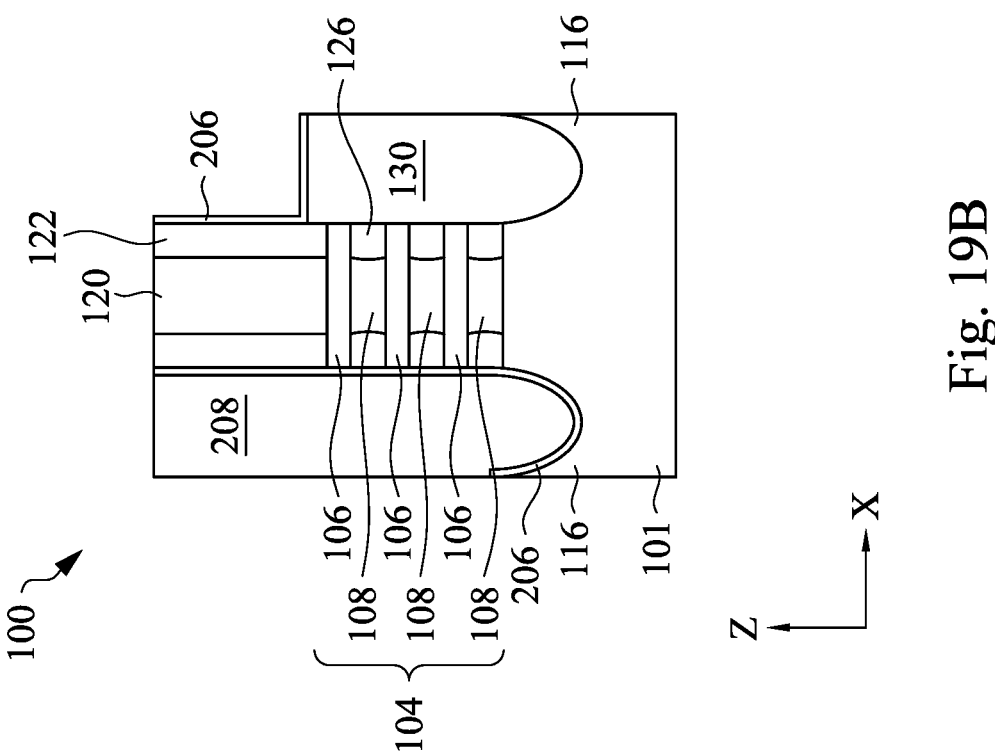
Figure 19A:
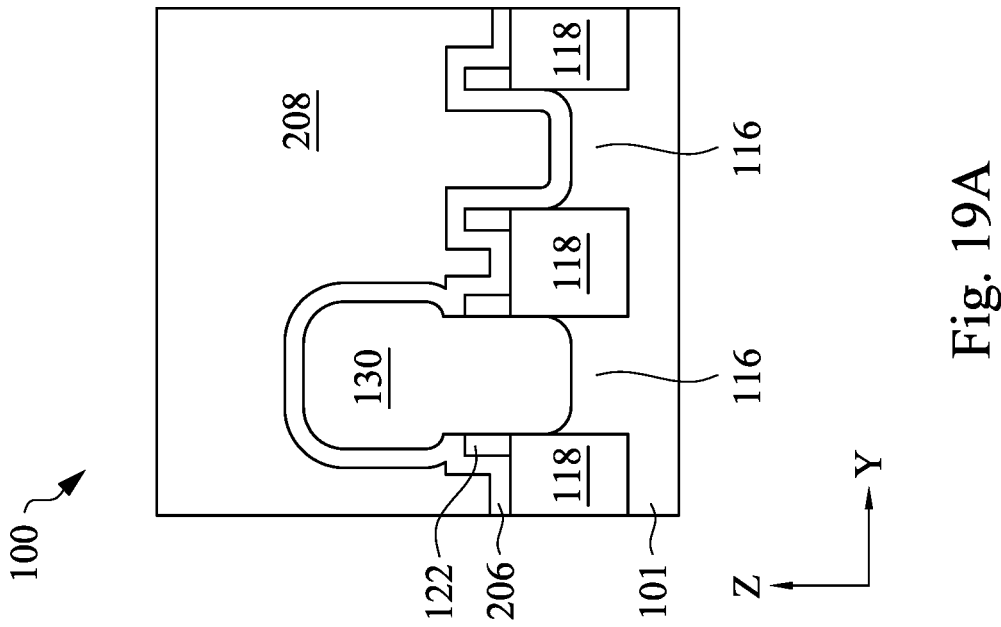

As shown in FIGS. 19A and 19B, another hard mask layer 206 is formed on the exposed surfaces of the semiconductor device structure 100, and another mask layer 208 is formed on portions of the hard mask layer 206 formed on the epitaxial features 130 and on the well portion 116 that the dielectric dummy S/D structure 150 (FIG. 21B) will subsequently form thereon.

Figure 20B:
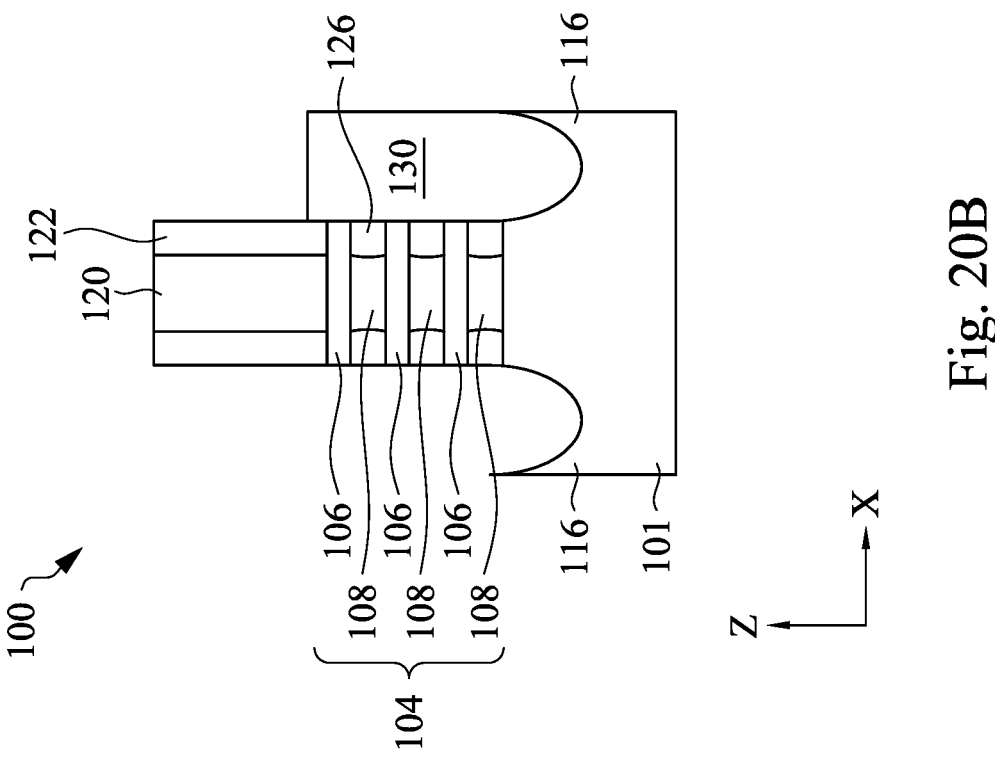
Figure 20A:
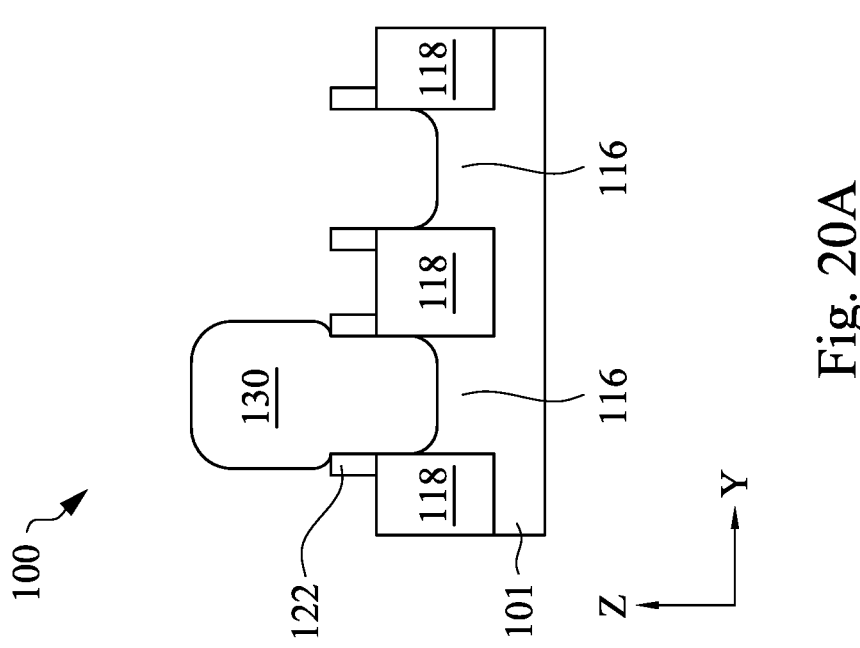

Next, as shown in FIGS. 20A and 20B, the exposed portion of the hard mask layer 206 not covered by the mask layer 208 is removed to expose the well portions 116 disposed thereunder, epitaxial features (not shown) are formed on the exposed well portions 116, and the mask layer 208 and the hard mask layer 206 disposed thereunder are removed. The epitaxial features (not shown) are opposite type as the epitaxial features 130. For example, if the epitaxial features 130 are n-type epitaxial features, the epitaxial features (not shown) are p-type epitaxial features. If the epitaxial features 130 are p-type epitaxial features, the epitaxial features (not shown) are n-type epitaxial features. As shown in FIGS. 20A and 20B, one or more well portions 116 do not have an epitaxial feature formed thereon, because the one or more well portions 116 are covered by the mask layer 208 and the hard mask layer 206.

Figure 21B:
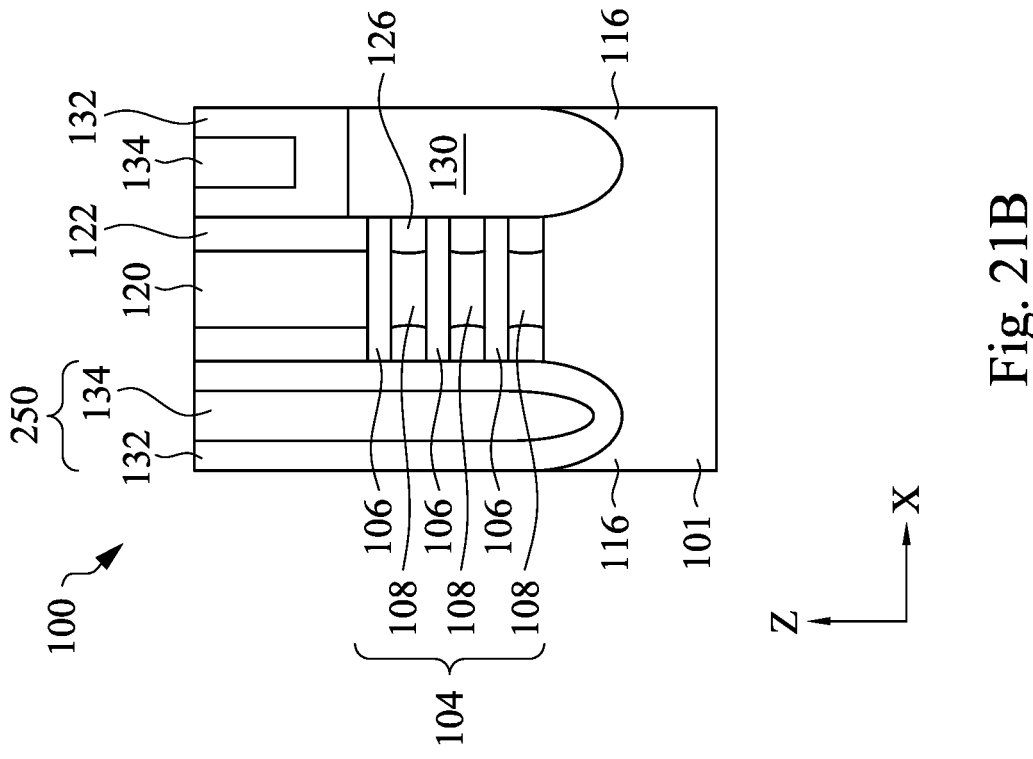
Figure 21A:
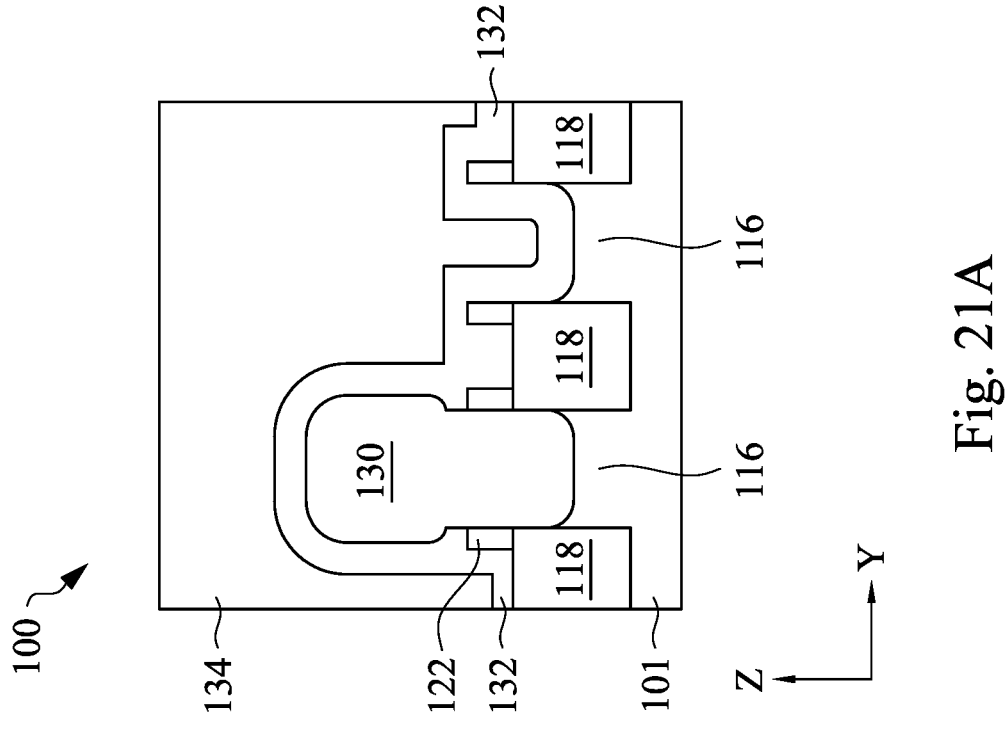

As shown in FIGS. 21A and 21B, the CESL 132 and the ILD layer 134 are formed on the semiconductor device structure 100. The CESL 132 is formed on the epitaxial features 130, the epitaxial features (not shown) that are opposite type as the epitaxial features 130, and the well portion 116, and the ILD layer 134 is formed on the CESL 132. As shown in FIG. 21B, the portion of the CESL 132 and ILD layer 134 disposed on the well portion 116 may form the dielectric dummy S/D structure 250. The dielectric dummy S/D structure 250 may be formed on the well portion 116 instead of an epitaxial feature.

Figure 22B:
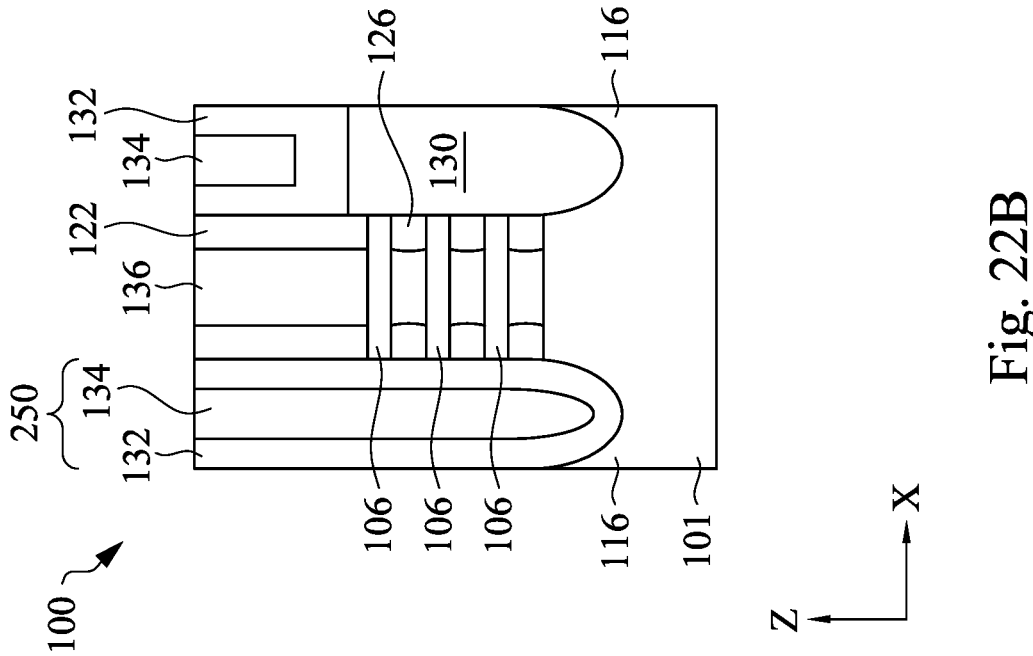
Figure 22A:
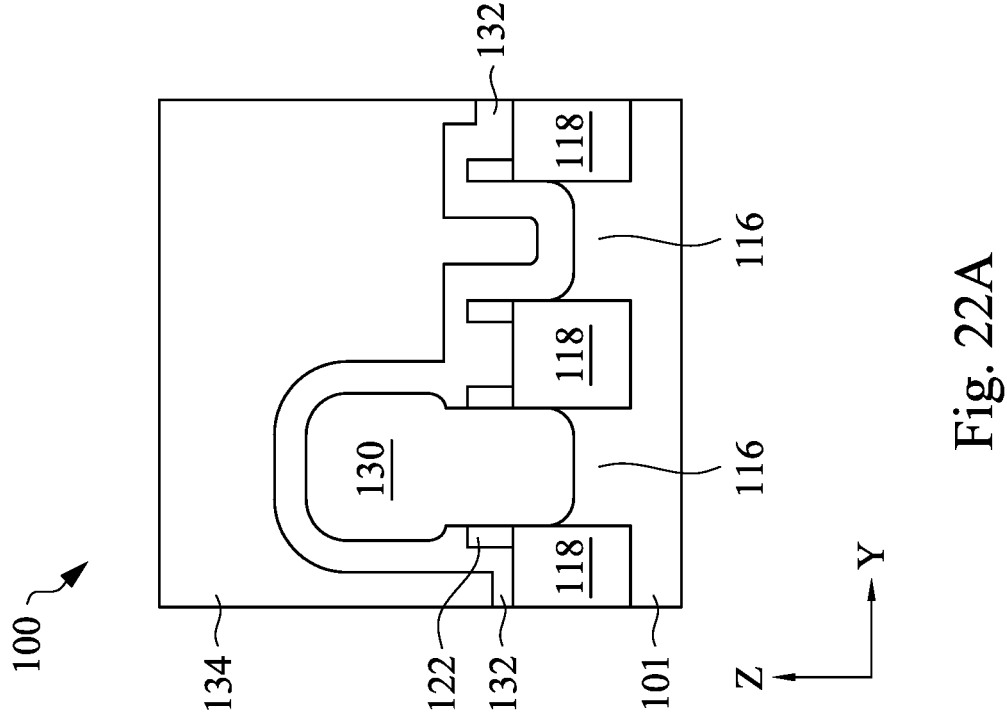

As shown in FIGS. 22A and 22B, the sacrificial gate structure and the second semiconductor layers 108 are removed, the gate dielectric layer (not shown) is formed to surround the exposed portions of the first semiconductor layers 106, and the gate electrode 136 is formed on the gate dielectric layer. The gate dielectric layer and the gate electrode 136 may be collectively referred to as a gate structure. In some embodiments, an interfacial layer (IL) (not shown)

is formed between the gate dielectric layer and the exposed surfaces of the first semiconductor layers 106. The removal of the sacrificial gate structure and the second semiconductor layers 108 may be performed by the processes described in FIGS. 10A and 10B. Similarly, the process to form the gate dielectric layer and the gate electrode 136 may be the same as the process described in FIGS. 10A and 10B.

In some embodiments, as shown in FIG. 22B, one or more first semiconductor layers 106 are nanostructure channels surrounded by the gate electrode 136. The epitaxial feature 130, which is a source or a drain region, is electrically connected to a first end of the one or more first semiconductor layers 106. In some embodiments, the epitaxial feature 130 is in contact with the first end of the one or more first semiconductor layers 106. The CESL 132 is in contact with a second end of the one or more first semiconductor layers 106. The second end is opposite of the first end. In some embodiments, the CESL 132 may have a "U" shaped cross-section, and the ILD layer 134 is disposed on and surrounded by the CESL 132.

The dielectric dummy S/D structure 250 may be disposed between adjacent gate electrodes 136 and between adjacent pluralities of first semiconductor layers 106. The CESL 132 extends from a first level to a second level. The first level may be the level of the top surface of the ILD layer 134, and the second level may be the level of the bottom 130b of the epitaxial feature 130. In some embodiments, the second level may be below the level of the bottom 130b of the epitaxial feature 130.

Figure 23B:
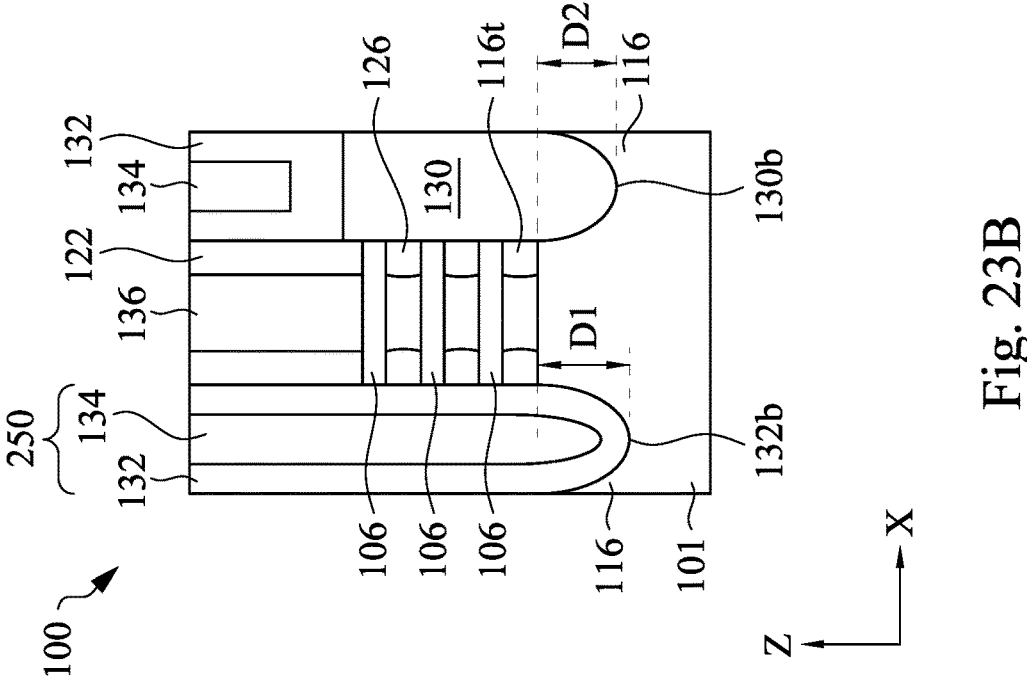
Figure 23A:
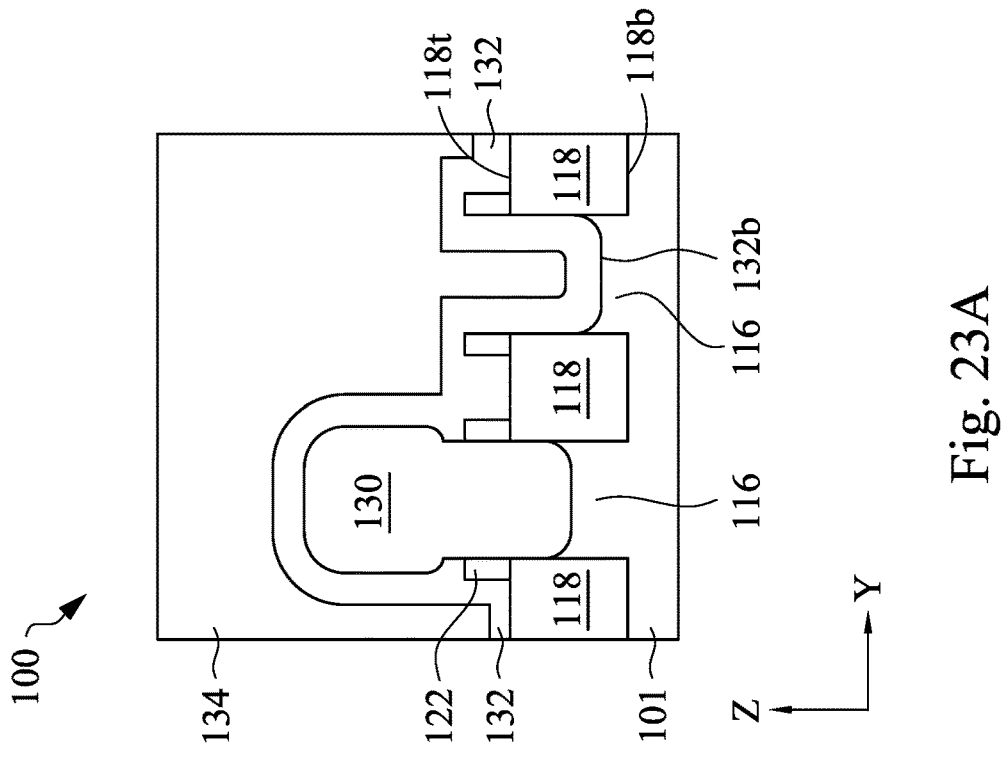

In some embodiments, the bottom of the CESL 132 is at the same level as the bottom of the epitaxial feature 130, as shown in FIGS. 22A and 22B. In some embodiments, the bottom 132b of the CESL 132 is at a level below the level of the bottom 130b of the epitaxial feature 130, such as about 5 nm to about 30 nm below the level of the bottom 130b, as shown in FIGS. 23A and 23B. The bottom 132b and the bottom 130b located at different levels may be achieved by adding another mask during the recess of the stack of semiconductor layers 104 as described in FIGS. 4A and 4B. The mask exposes the well portion 116 that the CESL 132 to be formed thereon, and the exposed well portion 116 is further recessed to a level below the level of other well portions 116. In some embodiments, the bottom 132b is located at a level between the top 118t and the bottom 118b of the isolation region 118. In some embodiments, the bottom 132b is located at the same level as the bottom 118b. In some embodiments, the bottom 132b is located at a level below the level of the bottom 118b. The lower level of the bottom 132b relative to the level of the bottom 130b of the epitaxial feature 130 may help to further improve junction isolation or to prevent PODE bottom epitaxial feature bridge.

Similar to the bottom 124b, the bottom 132b is the distance D1 away from the level of the top surface 116t, and the bottom 130b is the distance D2 away from the level of the top surface 116t. In some embodiments, the distance D1 is substantially the same as the distance D2, as shown in FIG. 22B. For example, both distances D1, D2 may range from about 30 nm to about 100 nm. In some embodiments, the distance D1 ranges from about 80 nm to about 200 nm and is substantially greater than the distance D2, such as about 5 nm to about 30 nm greater than the distance D2.

Figure 24:
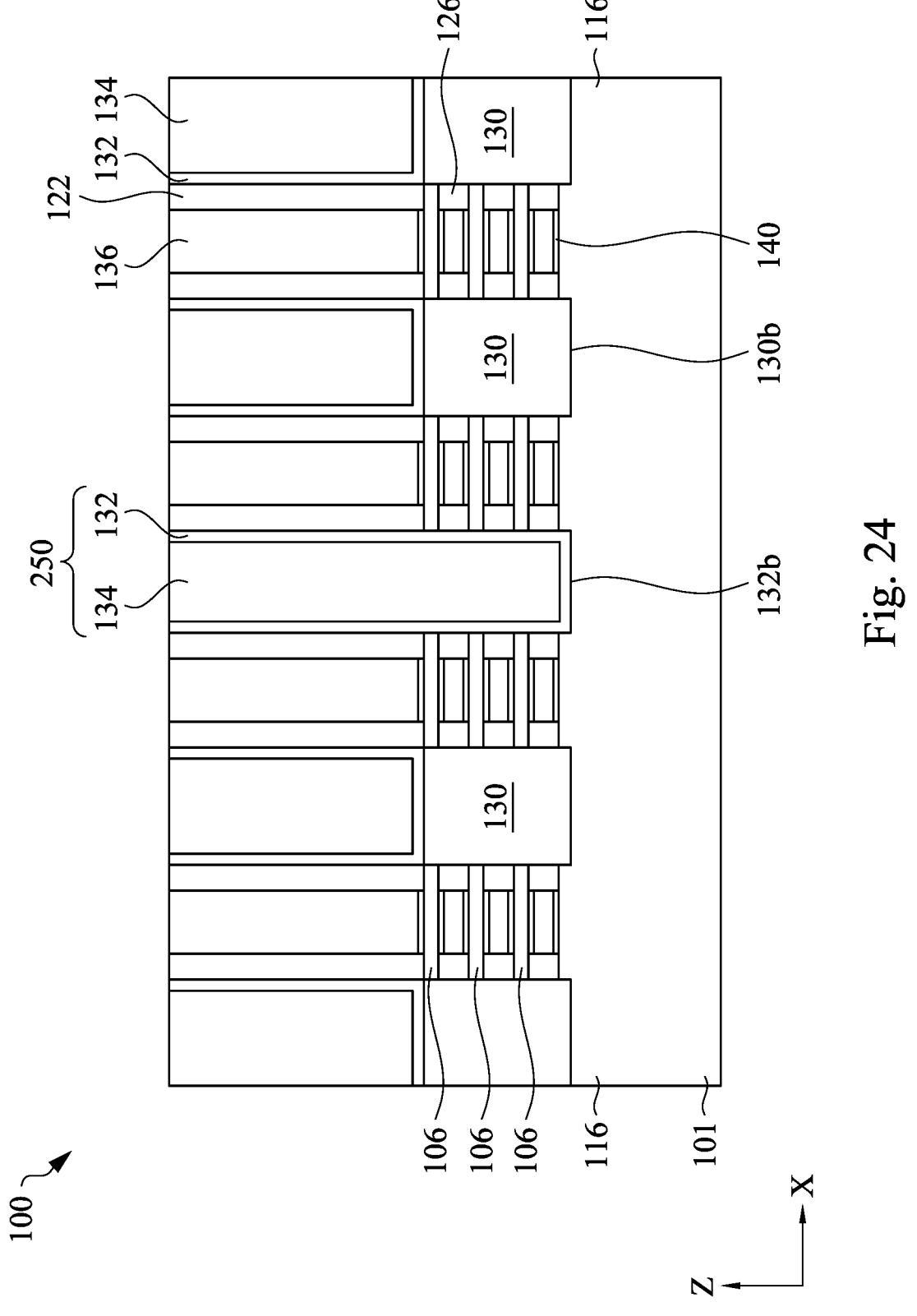
FIGS. 24-26 are cross-sectional side views of one of various stages of manufacturing the semiconductor device structure taken along line B-B of FIG. 1, in accordance with alternative embodiments.
Figure 25:
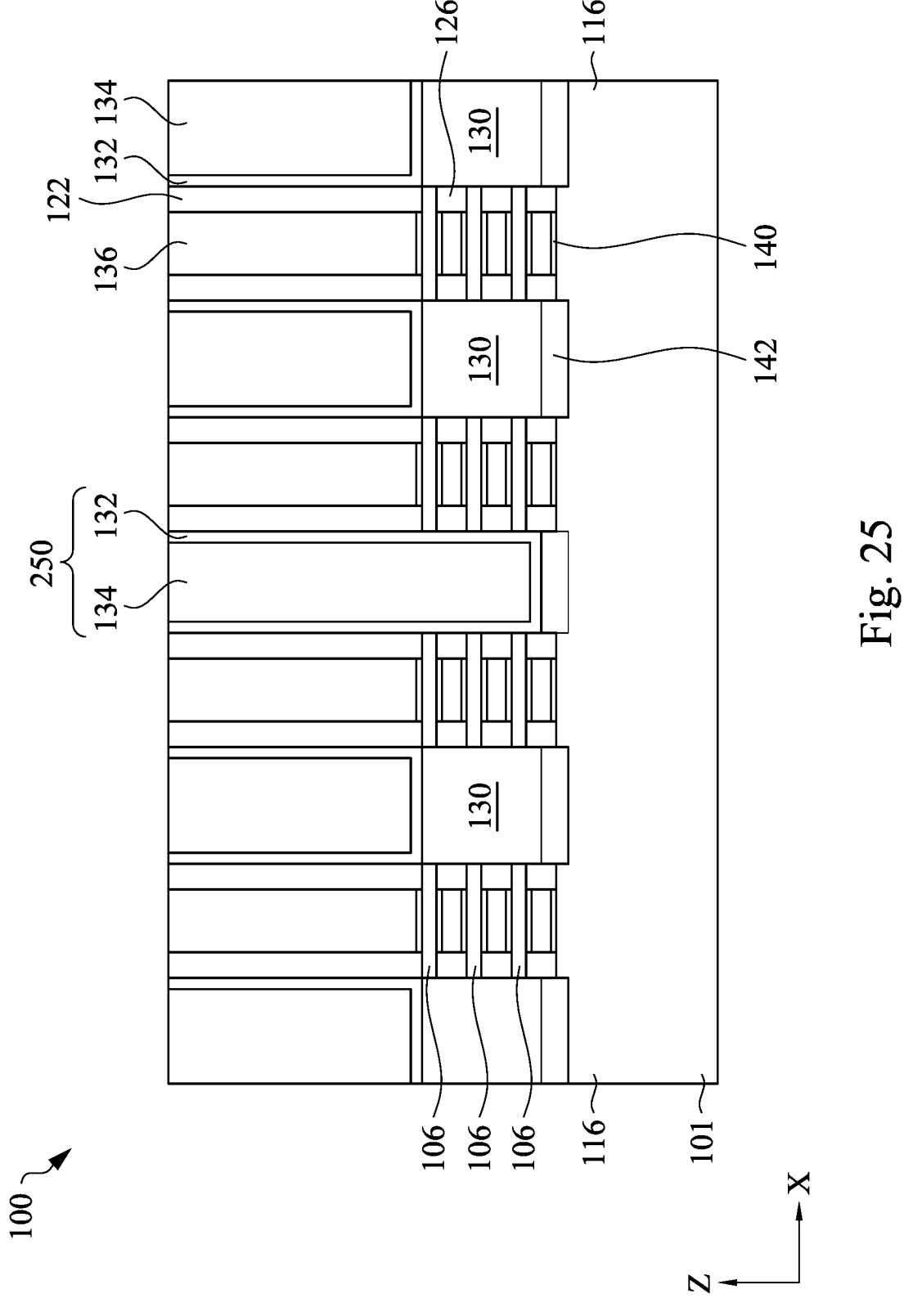
Figure 26:
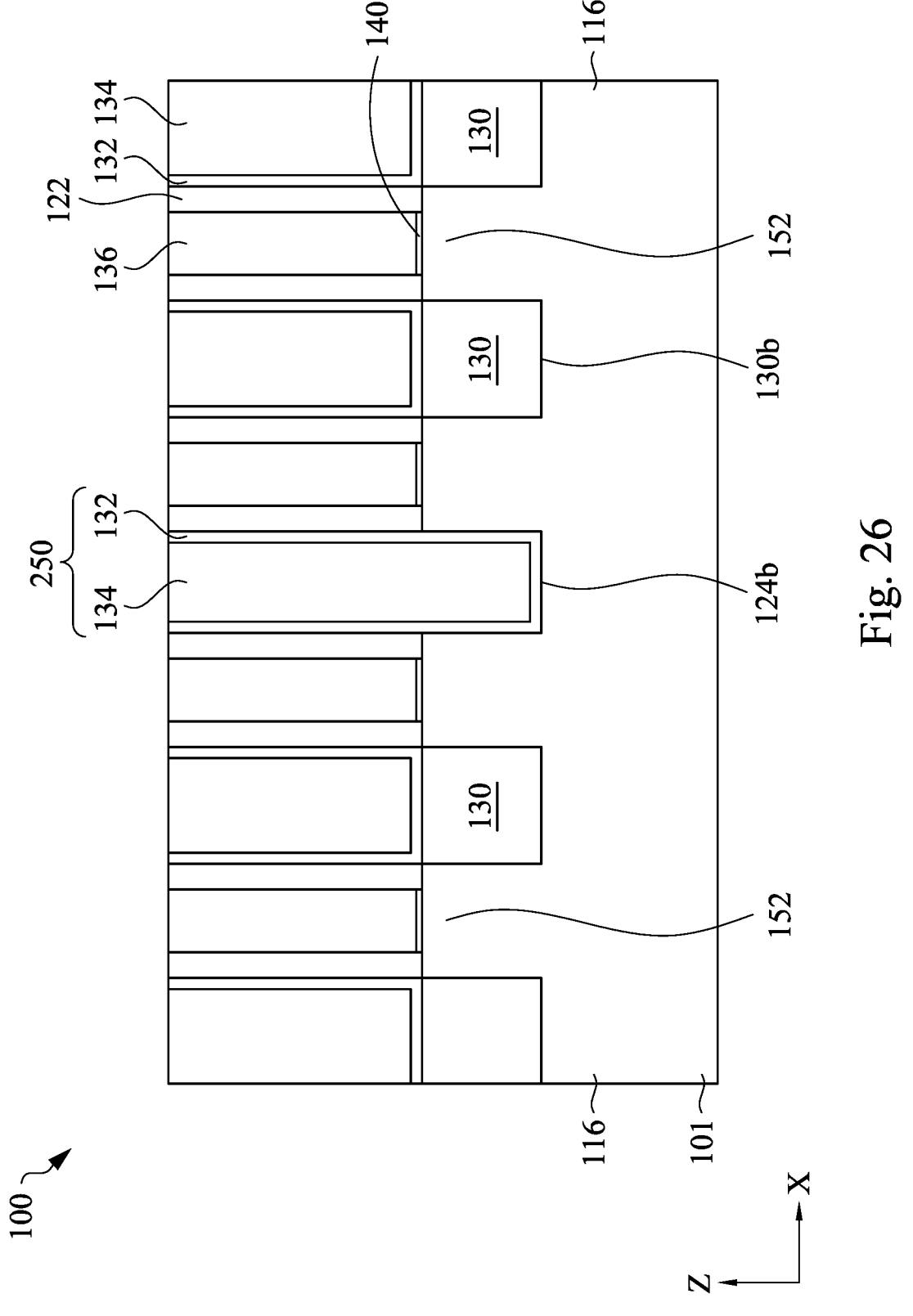

FIGS. 24-26 are cross-sectional side views of one of various stages of manufacturing the semiconductor device structure 100 taken along line B-B of FIG. 1, in accordance with alternative embodiments. As shown in FIG. 24, multiple gate electrodes 136 are disposed over the substrate 101. The IL 140 may be formed on the first semiconductor layers 106, the gate dielectric layer (not shown) is formed on the IL 140, and the gate electrode 136 is formed on the gate dielectric layer. As shown in FIG. 24, the dielectric dummy S/D structure 250 may be formed over the substrate 101 instead of an epitaxial feature. The dielectric dummy S/D structure 250 includes the CESL 132 and the ILD layer 134.

In some embodiments, the dielectric layer 142 is formed on the well portion 116, and the epitaxial features 130 are formed on the dielectric layer 142, as shown in FIG. 25. The epitaxial features 130 may be formed by growing from the first semiconductor layers 106. The dielectric layer 142 may be formed at stage after the processes described in FIGS. 16A and 16B. For example, a dielectric layer may be conformally formed on the exposed surfaces of the semiconductor device structure 100 shown in FIGS. 16A and 16B. An etch back process may be performed on the dielectric layer to form the dielectric layer 142. The CESL 132 is formed on the dielectric layer 142, as shown in FIG. 25. In some embodiments, the dielectric dummy S/D structure 250 includes the dielectric layer 142, the CESL 132, and the ILD layer 134.

In some embodiments, the semiconductor device structure 100 includes FinFETs instead of nanostructure channel FETs, as shown in FIG. 26. Instead of having one or more first semiconductor layers 106 as channel regions, each FinFET includes a channel region 152 disposed between adjacent epitaxial features 130 and between the dielectric dummy S/D structure 250 and the epitaxial features 130. The channel region 152 may include the same material as the substrate 101 or the well portion 116. The IL 140 may be formed on the channel region 152, the gate dielectric layer (not shown) may be formed on the IL 140, and the gate electrode 136 is formed on the gate dielectric layer.

Figure 27:
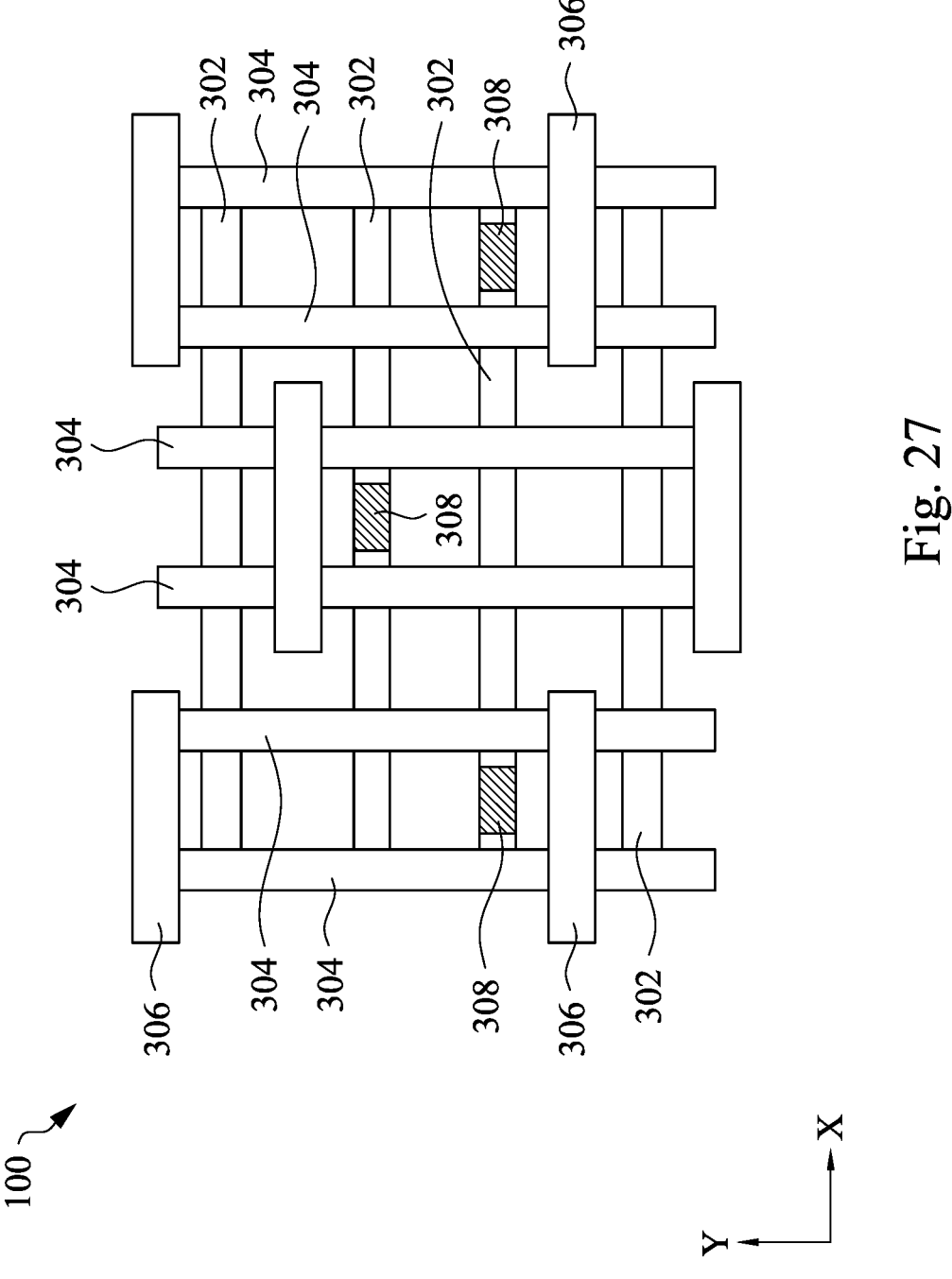
FIG. 27 is a top view of one of various stages of manufacturing the semiconductor device structure, in accordance with some embodiments.

FIG. 27 is a top view of one of various stages of manufacturing the semiconductor device structure 100, in accordance with some embodiments. As shown in FIG. 27, the semiconductor device structure 100 includes a plurality of gate electrodes 304 and a plurality of epitaxial features 302 disposed on opposite sides of the gate electrodes 304. The gate electrodes 304 may be the gate electrodes 136, and the gate spacers (not shown) and gate dielectric layer (not shown) are omitted for clarity. The epitaxial features 302 may be the epitaxial features 130 and the epitaxial features that are opposite type of the epitaxial features 130. Thus, in some embodiments, the epitaxial features 302 includes p-type epitaxial features and n-type epitaxial features. The p-type epitaxial features and the n-type epitaxial features are formed at different times, as described in FIGS. 8A, 8B, 20A, and 20B. The semiconductor device structure 100 further includes one or more dielectric dummy S/D structures 308, which may be the dielectric dummy S/D structures 150 or the dielectric dummy S/D structures 250. The dielectric dummy S/D structures 308 may be formed instead of an epitaxial feature 302 in order to provide junction isolation. As shown in FIG. 27, multiple dielectric dummy S/D structures 308 are formed. The semiconductor device structure 100 further includes one or more dielectric features 306 separating the gate electrode 304 into two or more portions of the gate electrode 304. The dielectric features 306 may be formed by a cut metal gate (CMG) process.

Embodiments of the present disclosure provide a semiconductor device structure including a dielectric dummy S/D structure. The dielectric dummy S/D structure may be formed at a location where an epitaxial feature would be formed. Some embodiments may achieve advantages. For example, the dielectric dummy S/D structure can help with junction isolation or prevention of PODE bottom epitaxial feature bridge.

An embodiment is a semiconductor device structure. The structure includes a semiconductor layer disposed over a substrate, and the semiconductor layer has a first end and a second end opposite the first end. The structure further includes an epitaxial feature disposed over the substrate, and the epitaxial feature is electrically connected to the first end of the semiconductor layer. The structure further includes a first dielectric layer disposed over the substrate, and the first dielectric layer is in contact with the second end of the semiconductor layer. The structure further includes a contact etch stop layer disposed on and in contact with the first dielectric layer and an interlayer dielectric layer disposed on and in contact with the contact etch stop layer.

Another embodiment is a semiconductor device structure. The structure includes a semiconductor layer disposed over a substrate, and the semiconductor layer has a first end and a second end opposite the first end. The structure further includes an epitaxial feature disposed over the substrate, and the epitaxial feature is electrically connected to the first end of the semiconductor layer. The structure further includes a contact etch stop layer disposed over the substrate, and the contact etch stop layer is in contact with the second end of the semiconductor layer. The structure further includes an interlayer dielectric layer disposed on and in contact with the contact etch stop layer.

A further embodiment is a method for forming a semiconductor device structure. The method includes forming a sacrificial gate electrode over a portion of a stack of semiconductor layers, recessing exposed portions of the stack of semiconductor layers not covered by the sacrificial gate electrode to expose first and second well portions, removing edge portions of second semiconductor layers of the stack of semiconductor layers to create cavities, forming a first dielectric layer on the first and second well portions and in the cavities, forming a mask layer on a portion of the first dielectric layer disposed on the first well portion, removing a portion of the first dielectric layer not covered by the mask layer to expose the second well portion, and forming an epitaxial feature over the second well portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a semiconductor layer disposed over a substrate, wherein the semiconductor layer has a first end and a second end opposite the first end;
an epitaxial feature disposed over the substrate, wherein the epitaxial feature is electrically connected to the first end of the semiconductor layer;
a first dielectric layer disposed over the substrate, wherein the first dielectric layer interfaces the second end of the semiconductor layer;

a contact etch stop layer disposed on and interfacing the first dielectric layer;

an interlayer dielectric layer disposed on and interfacing the contact etch stop layer; and a second dielectric layer disposed between the first dielectric layer and the contact etch stop layer.

2. The semiconductor device structure of claim 1, further comprising a first dielectric spacer interfacing the epitaxial feature and a second dielectric spacer interfacing the first dielectric layer.

3. The semiconductor device structure of claim 2, further comprising a gate electrode disposed between the first and second dielectric spacers.

4. The semiconductor device structure of claim 3, further comprising a spacer disposed adjacent the gate electrode.

5. The semiconductor device structure of claim 4, wherein the first dielectric layer is disposed adjacent the spacer.

6. The semiconductor device structure of claim 5, wherein the first dielectric layer interfaces the spacer.

7. The semiconductor device structure of claim 1, wherein a bottom of the first dielectric layer is located at a level substantially below a level of a bottom of the epitaxial feature.

8. A semiconductor device structure, comprising:

a first semiconductor layer disposed over a substrate, wherein the first semiconductor layer has a first end and a second end opposite the first end;

an epitaxial feature disposed over the substrate, wherein the epitaxial feature is electrically connected to the first end of the first semiconductor layer;

a contact etch stop layer disposed over the substrate, wherein the contact etch stop layer interfaces the second end of the first semiconductor layer;

an interlayer dielectric layer disposed on and interfacing the contact etch stop layer; and a bottom of the epitaxial feature is located at a same level as a bottom of the contact etch stop layer.

9. The semiconductor device structure of claim 8, further comprising a first dielectric spacer interfacing the epitaxial feature and a second dielectric spacer interfacing the contact etch stop layer.

10. The semiconductor device structure of claim 9, further comprising a gate electrode disposed between the first and second dielectric spacers.

11. The semiconductor device structure of claim 8, further comprising a second semiconductor layer disposed over the first semiconductor layer, wherein the second semiconductor layer has a first end and a second end.

12. The semiconductor device structure of claim 11, wherein the first end of the second semiconductor layer is electrically connected to the epitaxial feature, and the second end of the second semiconductor layer interfaces the contact etch stop layer.

13. A method for forming a semiconductor device structure, comprising:

forming a sacrificial gate electrode over a portion of a stack of semiconductor layers;

recessing exposed portions of the stack of semiconductor layers not covered by the sacrificial gate electrode to expose first and second well portions;

removing edge portions of second semiconductor layers of the stack of semiconductor layers to create cavities;

forming a first dielectric layer on the first and second well portions and in the cavities;

forming a mask layer on a portion of the first dielectric layer disposed on the first well portion;

removing a portion of the first dielectric layer not covered by the mask layer to expose the second well portion; and forming an epitaxial feature over the second well portion.

14. The method of claim 13, wherein the portion of the first dielectric layer not covered by the mask layer is removed by an anisotropic etch process.

15. The method of claim 13, further comprising removing the mask layer.

16. The method of claim 13, further comprising forming a second dielectric layer on the second well portion, wherein the epitaxial feature is formed on the second dielectric layer.

17. The method of claim 16, wherein the second dielectric layer is also formed on the first dielectric layer.

18. The method of claim 17, further comprising forming a contact etch stop layer on the epitaxial feature and on the first dielectric layer.

19. The method of claim 18, further comprising forming an interlayer dielectric layer on the contact etch stop layer.

20. The method of claim 17, further comprising forming a contact etch stop layer on the epitaxial feature and on the second dielectric layer.

* * * * *